US011994848B2

(12) United States Patent
Onvlee et al.

(10) Patent No.: US 11,994,848 B2
(45) Date of Patent: May 28, 2024

(54) SYSTEMS AND METHODS FOR ADJUSTING PREDICTION MODELS BETWEEN FACILITY LOCATIONS

(71) Applicant: ASML NETHERLANDS B.V., Veldhoven (NL)

(72) Inventors: Johannes Onvlee, 's-Hertogenbosch (NL); Arnaud Hubaux, Erpent (NL)

(73) Assignee: ASML NETHERLANDS B.V., Veldhoven (NL)

( * ) Notice: Subject to any disclaimer, the term of this patent is extended or adjusted under 35 U.S.C. 154(b) by 142 days.

(21) Appl. No.: 17/601,503

(22) PCT Filed: Mar. 12, 2020

(86) PCT No.: PCT/EP2020/056653
§ 371 (c)(1),
(2) Date: Oct. 5, 2021

(87) PCT Pub. No.: WO2020/207696
PCT Pub. Date: Oct. 15, 2020

(65) Prior Publication Data
US 2022/0197264 A1  Jun. 23, 2022

(30) Foreign Application Priority Data

Apr. 9, 2019 (EP) .................................... 19168014
May 21, 2019 (EP) .................................... 19175717

(51) Int. Cl.
*G05B 19/418* (2006.01)
(52) U.S. Cl.
CPC .................. *G05B 19/41885* (2013.01); *G05B 2219/32335* (2013.01); *G05B 2219/45031* (2013.01)

(58) Field of Classification Search
CPC .... G05B 19/41885; G05B 2219/32335; G05B 2219/45031; G05B 19/41875;
(Continued)

(56) References Cited

U.S. PATENT DOCUMENTS 5,229,872 A   7/1993  Mumola
6,046,792 A   4/2000  Van Der Werf et al.
(Continued)

FOREIGN PATENT DOCUMENTS

EP   3229152   10/2017
EP   3352013    7/2018
(Continued)

OTHER PUBLICATIONS

Hardesty Larry, Explained: Neural networks, https://news.mit.edu/2017/explained-neural-networks-deep-learning-0414, Apr. 14, 2017 (Year: 2017).*

(Continued)

*Primary Examiner* — Mark A Connolly
(74) *Attorney, Agent, or Firm* — Pillsbury Winthrop Shaw Pittman, LLP

(57) ABSTRACT

A method for configuring a semiconductor manufacturing process, the method including: providing an initial prediction model including a plurality of model parameters to one or more remote locations; receiving at least one updated model parameter from the one or more remote locations, the at least one model parameter is updated by training the initial prediction model with local data at the one or more remote locations; determining aggregated model parameters based on the at least one updated model parameter received from the one or more remote locations; and adjusting the initial prediction model based on the aggregated model parameters, the adjusted prediction model being operable to configure the semiconductor manufacturing process.

20 Claims, 19 Drawing Sheets

(58) Field of Classification Search
CPC ........... G05B 2219/32193; G05B 2219/37224; Y02P 90/30; Y02P 90/02; G03F 7/70175; G03F 7/70283; G03F 7/705; G03F 7/70916; G03F 7/70; G06N 3/045; G06N 3/08; G06N 20/20; G06Q 10/04; G06Q 50/04; G06Q 10/06
See application file for complete search history.

(56) References Cited

U.S. PATENT DOCUMENTS

| | | | |
|---|---|---|---|
| 7,587,704 B2 | 8/2009 | Ye et al. | |
| 8,200,468 B2 | 6/2012 | Ye et al. | |
| 2007/0031745 A1 | 2/2007 | Ye et al. | |
| 2007/0050749 A1 | 3/2007 | Ye et al. | |
| 2008/0301620 A1 | 12/2008 | Ye et al. | |
| 2008/0309897 A1 | 12/2008 | Wong et al. | |
| 2009/0157630 A1 | 6/2009 | Yuan | |
| 2010/0162197 A1 | 6/2010 | Ye et al. | |
| 2010/0180251 A1 | 7/2010 | Ye et al. | |
| 2013/0290223 A1 | 10/2013 | Chapelle et al. | |
| 2015/0012255 A1* | 1/2015 | Li | G05B 17/02 703/6 |
| 2015/0242760 A1 | 8/2015 | Miao et al. | |
| 2019/0004418 A1 | 1/2019 | Jeong | |

FOREIGN PATENT DOCUMENTS

| | | |
|---|---|---|
| KR | 2019-0003909 | 10/2019 |
| WO | 2018/033890 | 2/2018 |
| WO | 2018/196631 | 11/2018 |

OTHER PUBLICATIONS

Office Action issued in corresponding Korean Patent Application No. 10-2021-7032644, dated Aug. 7, 2023.
International Search Report and Written Opinion issued in corresponding PCT Patent Application No. PCT/EP2020/056653, dated Jun. 3, 2020.

* cited by examiner

SYSTEMS AND METHODS FOR ADJUSTING PREDICTION MODELS BETWEEN FACILITY LOCATIONS

CROSS-REFERENCE TO RELATED APPLICATIONS

This application is the U.S. national phase entry of PCT Patent Application No. PCT/EP2020/056653 which was filed Mar. 12, 2020, which claims the benefit of priority of European Patent Application No. 19168014.9 which was filed on Apr. 9, 2019, and of European Patent Application No. 19175717.8 which was filed on May 21, 2019, each of which is incorporated herein in its entirety by reference.

TECHNICAL FIELD

The description herein relates generally to patterning processes. More particularly, the description relates to systems and methods for adjusting prediction models between facility locations.

BACKGROUND

A lithographic projection apparatus can be used, for example, in the manufacture of integrated circuits (ICs). In such a case, a patterning device (e.g., a mask) may contain or provide a pattern corresponding to an individual layer of the IC ("design layout"), and this pattern can be transferred onto a target portion (e.g. comprising one or more dies) on a substrate (e.g., silicon wafer) that has been coated with a layer of radiation-sensitive material ("resist"), by methods such as irradiating the target portion through the pattern on the patterning device. In general, a single substrate contains a plurality of adjacent target portions to which the pattern is transferred successively by the lithographic projection apparatus, one target portion at a time. In one type of lithographic projection apparatus, the pattern on the entire patterning device is transferred onto one target portion in one operation. Such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the pattern on the patterning device are transferred to one target portion progressively. Since, in general, the lithographic projection apparatus will have a reduction ratio M (e.g., 4), the speed F at which the substrate is moved will be 1/M times that at which the projection beam scans the patterning device. More information with regard to lithographic devices as described herein can be gleaned, for example, from U.S. Pat. No. 6,046,792, incorporated herein by reference.

Prior to transferring the pattern from the patterning device to the substrate, the substrate may undergo various procedures, such as priming, resist coating and a soft bake. After exposure, the substrate may be subjected to other procedures ("post-exposure procedures"), such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc. One or more metrology processes are typically involved in the patterning process.

As noted, lithography is a central step in the manufacturing of device such as ICs, where patterns formed on substrates define functional elements of the devices, such as microprocessors, memory chips, etc. Similar lithographic techniques are also used in the formation of flat panel displays, micro-electro mechanical systems (MEMS) and other devices.

As semiconductor manufacturing processes continue to advance, the dimensions of functional elements have continually been reduced while the amount of functional elements, such as transistors, per device has been steadily increasing over decades, following a trend commonly referred to as "Moore's law". At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is commonly known as low-$k_1$ lithography, according to the resolution formula $CD=k_1 \times \lambda/NA$, where $\lambda$ is the wavelength of radiation employed (currently in most cases 248 nm or 193 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a designer in order to achieve particular electrical functionality and performance. To overcome these difficulties, sophisticated fine-tuning steps are applied to the lithographic projection apparatus, the design layout, or the patterning device. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET). The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

SUMMARY

According to an embodiment, there is provided a method for configuring a semiconductor manufacturing process, the method comprising: providing an initial prediction model comprising a plurality of model parameters to one or more remote locations; training the initial prediction model with local data at the one or more remote locations such that at least one model parameter is updated;

receiving the at least one updated model parameter from the one or more remote locations; determining aggregated model parameters based on the at least one updated model parameter received from the one or more remote locations; and adjusting the initial prediction model based on the aggregated model parameters, the adjusted prediction model being operable to configure the semiconductor manufacturing process.

According to an embodiment, there is provided a method for adjusting a lithography process. In some embodiments, the method comprises adjusting a prediction model used for enhancing the lithography process. The method comprises providing an initial prediction model comprising a plurality of model parameters to one or more remote locations. The method comprises training the initial prediction model with local data at the one or more remote locations such that at least one model parameter is updated. The method comprises receiving the at least one updated model parameter from each of the one or more remote locations where the initial prediction model was trained. The method comprises determining aggregated updated model parameters based on the at least one updated model parameter received from the one or more remote locations. The method comprises adjusting the initial prediction model based on the aggregated updated model parameters. The adjusted prediction model is operable to enhance the lithography process.

In an embodiment, the at least one model parameter comprises a weight.

In an embodiment, the method further comprises, prior to providing the initial prediction model to the one or more remote locations, training the initial prediction model using global data. The global data comprises a different data set, and/or a data set related to but not the same as the local data (e.g., such that after training the model is close enough, to allow fine-tuning the local model with (limited) local data (e.g., not all variables do need to be updated). The global data is associated with more than one of the remote locations such that the training of the initial prediction model with local data at the one or more remote locations comprises retraining the initial prediction model to update the at least one model parameter to better reflect the details of the local data.

In an embodiment, training the initial prediction model using global data comprises training the initial prediction model with image data associated with a reticle or collector, and defect information associated with contamination or image performance.

In an embodiment, the prediction model is a neural network. In an embodiment, the at least one model parameter comprises a weight and a bias of the neural network.

In an embodiment, the adjusted prediction model being operable to enhance the lithography process comprises the adjusted prediction model being used to recognize reticle contamination in the lithography process. In an embodiment, the adjusted prediction model being operable to enhance the lithography process comprises the adjusted prediction model being used to determine whether collector contamination is at an acceptable level for an exposure in the lithography process.

In an embodiment, the one or more remote locations comprise one or more facility locations remote from a facility location where the initial prediction model is generated and trained, the updated model parameters are received, the aggregated updated model parameters are determined, and the adjusted prediction model is determined.

In an embodiment, the generating and training of the initial prediction model is performed by a service provider; providing the initial prediction model to the one or more remote locations is performed by the service provider; the remote locations and the local data are associated with customers of the service provider; the updated model parameters are received from each of the one or more remote locations by the service provider; the aggregated updated model parameters received from each of the one or more remote locations are determined by the service provider; and the adjusted prediction model is determined by the service provider based on the aggregated updated model parameters.

In an embodiment, the method further comprises iteratively providing the adjusted prediction model to the one or more remote locations, receiving the updated model parameters, determining the aggregated updated model parameters, and readjusting the adjusted prediction model until a stop condition is satisfied. In an embodiment, the stop condition comprises convergence of the readjusted prediction model. In and embodiment, the convergence of the readjusted prediction model comprises an amount of change in the aggregated updated model parameters being within a threshold amount of change.

In an embodiment, the local data is kept local to each of the one or more remote locations and is not shared with (1) a location that provides the initial prediction model, the updated model parameters are received, the aggregated updated model parameters are determined, and the adjusted prediction model is determined, or (2) other ones of the remote locations.

In an embodiment, determining the aggregated updated model parameters comprises averaging corresponding model parameters received from each of the one or more remote locations.

In an embodiment, the method further comprises providing the initial prediction model to a first remote location where the initial prediction model is trained with local data such that weights of the initial prediction model are updated based on the local data at the first remote location; receiving the updated weights from the first remote location; adjusting the initial prediction model based on the updated weights received from the first remote location; providing the adjusted prediction model to a second remote location where the adjusted prediction model is retrained with local data such that the weights are reupdated based on the local data at the second remote location; receiving the reupdated weights from the second remote location; and readjusting the adjusted prediction model based on the reupdated weights received from the second remote location.

In an embodiment, the method further comprises iteratively providing the readjusted prediction model to additional remote locations, receiving the reupdated weights, and further adjusting the readjusted prediction model based on the reupdated weights.

In an embodiment, the method further comprises performing a sanity check on one or both of the provided initial prediction model or the at least one model parameter.

In an embodiment, the method further comprises performing a sanity check on the updated at least one model parameter received from each of the one or more remote locations.

In an embodiment, the method further comprises encrypting one or both of the provided initial prediction model or the plurality of model parameters. In an embodiment, the encryption is configured such that the training with local data occurs without decryption of the provided initial prediction model. In an embodiment, the method further comprises decrypting the updated at least one model parameter received from each of the one or more remote locations.

In an embodiment, the initial prediction model is provided to one or more model servers at each of the one or more remote locations. A given model server is separate from a local data server at a given remote location.

In an embodiment, the initial prediction model comprises a partially trained prediction model. The partially trained prediction model comprises the plurality of model parameters such that, after provision to a given remote location, the training with local data comprises fully training the initial prediction model.

According to another embodiment, there is provided a method for adjusting a prediction model comprising a plurality of model parameters. The method comprises providing local training data associated with a semiconductor manufacturing process to the prediction model to determine first updated model parameter values. The method comprises receiving second updated model parameter values obtained by providing the prediction model at least partially with external training data. The method comprises adjusting the prediction model based on an expected improvement of a prediction model accuracy. The adjusting comprises updating the model parameters with the first updated model parameter values and/or second updated model parameter values.

In an embodiment, the plurality of model parameters comprise a weight, the first updated model parameter values include a first updated weight value, and the second updated model parameter values include a second updated weight value.

In an embodiment, the method further comprises, prior to providing the local training data to the prediction model, training the prediction model using global data. The global data comprises a different data set, and/or a data set that is similar to but not the same as the local training data. In some embodiments, the global data may be associated with more than one of the remote locations such that providing the local training data comprises retraining (parts of) the prediction model to determine the first updated model parameter values. For example, a service provider may be able to collect sufficient data with one particular lithography machine setting, but customers use the lithography system with a different machine setting. In this example, part of the model parameters trained on service provider data may be sufficiently valid, but other parts may require training on the customer data, to make the model better fit the data as generated by the customer.

In an embodiment, the prediction model is a neural network. In an embodiment, the plurality of model parameter comprise a weight and a bias of the neural network.

In an embodiment, the method further comprises providing the prediction model to a remote location. The remote location comprises a facility location remote from a facility location where the prediction model is generated. The remote location comprises the facility location where: the local training data associated with the semiconductor manufacturing process is provided to the prediction model to determine the first updated model parameter values; the second updated model parameter values are received; and the prediction model is adjusted.

In an embodiment, the prediction model is provided by a service provider, and the remote location and the local training data are associated with a customer of the service provider. In an embodiment, the local training data is kept local to the customer and is not shared with the service provider.

In an embodiment, the method further comprises performing a sanity check on the prediction model.

In an embodiment, the prediction model is encrypted.

According to another embodiment, there is provided a method for adjusting a neural network used for enhancing a lithography process. The method comprises training an initial neural network based on training data. The training data comprises process data and corresponding performance data for the lithography process. The initial neural network comprises a plurality of weights. The method comprises transmitting the initial neural network to one or more remote locations where the initial neural network is retrained with local data. The local data comprises process data and corresponding performance data for lithography processes associated with the remote locations, such that the weights are updated based on the local data at each of the one or more remote locations. The method comprises receiving the updated weights from each of the one or more remote locations; determining aggregated updated weights received from each of the one or more remote locations; and adjusting the initial neural network based on the aggregated updated weights. The adjusted neural network being operable to enhance the lithography process.

In an embodiment, the adjusted neural network being operable to enhance the lithography process comprises the adjusted neural network being used to recognize and classify (size of) reticle contamination in the photolithography process. In an embodiment, the adjusted neural network being operable to enhance the lithography process comprises the adjusted neural network being used to determine whether collector contamination is at an acceptable level for an exposure in the photolithography process.

In an embodiment, the one or more remote locations comprise one or more facility locations remote from a facility location where the initial neural network is generated and trained, the updated weights are received, the aggregated updated weights are determined, and the adjusted neural network is determined.

In an embodiment, generating and training of the initial neural network is performed by a service provider; providing the initial neural network to the one or more remote locations is performed by the service provider; the remote locations and the local data are associated with customers of the service provider; the updated weights are received from each of the one or more remote locations by the service provider; the aggregated updated weights are determined by the service provider; and the adjusted neural network is determined by the service provider based on the aggregated updated weights.

According to another embodiment, there is provided a computer program product comprising a non-transitory computer readable medium having instructions recorded thereon, the instructions when executed by a computer implementing the method(s) described above.

BRIEF DESCRIPTION OF THE DRAWINGS

The accompanying drawings, which are incorporated in and constitute a part of the specification, illustrate one or more embodiments and, together with the description, explain these embodiments. Embodiments of the invention will now be described, by way of example only, with reference to the accompanying schematic drawings in which corresponding reference symbols indicate corresponding parts, and in which.

DETAILED DESCRIPTION

Figure 1:
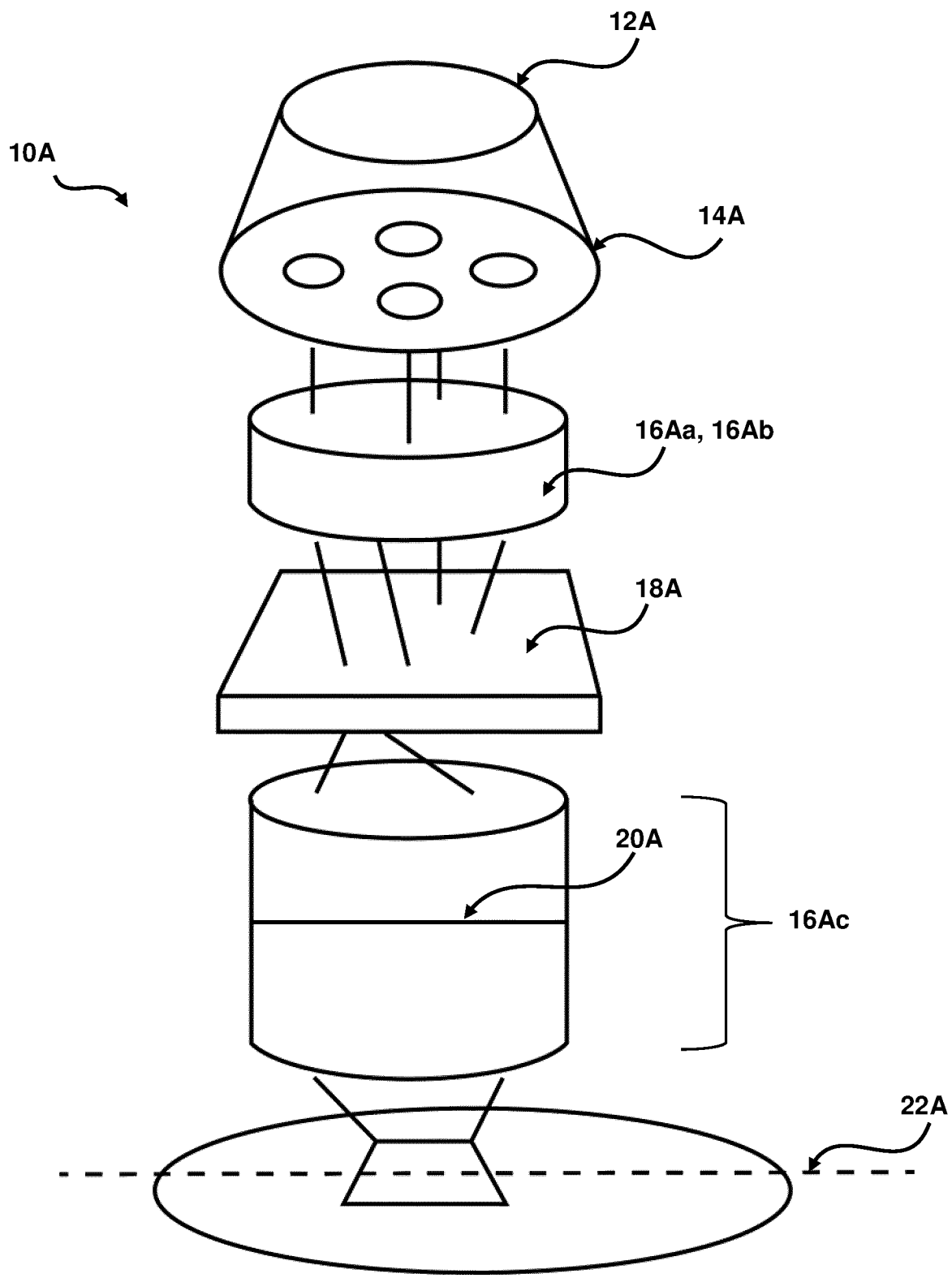
FIG. 1 shows a block diagram of various subsystems of a lithography system, according to an embodiment.

Complex, data driven technologies play an increasing role in business for service providers and their customers. Data generated by or for these technologies may include information which can be monetized. For this and other reasons, customers may be reluctant to share data with service providers, since it may be difficult to assess the value of data before it is shared. The example of a service provider and customers is not intended to be limiting. Other applications are contemplated. For example, the systems and methods described herein may be used any type of provider and associated user of whatever the provider provides.

Data based prediction models are used in many solutions for diverse problems. A neural network is an example of a prediction model. One way to train a neural network is training using labeled training data. The labeled training data includes process data (e.g., for a lithography process) and corresponding performance data. The performance data is determined, for example, by human inspection and/or other methods. For some service providers, a neural network (or any other prediction model) may require training with data which belongs to, and/or is only available at a customer location.

The present systems and methods comprise a data control and prediction model (e.g., neural network) training architecture that supports training on customer data without the need for the customer to share that data. Advantageously, this architecture may reduce or eliminate a risk that customer data (and/or other intellectual property belonging to the customer) is unintentionally disseminated from a customer location, while still being able to provide an optimized prediction model. The present systems and methods are configured to facilitate the training of complex models using data from multiple customers, without the need to actually access that data (e.g., from a service provider's point of view). This allows training of a prediction model using customer data such that the service provider can deliver optimal models to participating customers, without introducing (or at least reducing) the risk of unintentional data dissemination from customer locations.

For example, machine learning can be applied on data generated by, and available on, lithography systems. In some cases, data is relatively sparse, and it may be feasible to share the data across different (e.g., customer) sites (e.g., multiple sites associated with a single customer, or different sites associated with different customers), to facilitate training a model associated with a lithography system on the available data. However, customers are often reluctant to share data (with a supplier, with each other, etc.) because they want to protect their intellectual property (e.g., the data)

and/or for other reasons. The present systems and methods facilitate sharing an initial model to multiple systems (e.g., at multiple sites, potentially multiple customers), allows customers to execute a learning step, and lets customers only share locally updated model parameters with a service provider. The present systems and methods do not require customers to share their own local data. With the present systems and methods, the service provider may repeat the described process(es) until a model has converged, for example (e.g., a 'federated learning' approach). In some embodiments, the present systems and methods are configured to facilitate pre-training a model on one data-set, which is related to (but not the same as) data-set(s) local to customer(s), and distributing the pre-trained model to customer(s), who will 'fine-tune' (part of) the model by continuing the training on customer(s) local data. The final model is not returned to the supplier, or distributed in any other way (e.g., a 'transfer learning' approach, which may apply if customer data is insufficient to train the full model).

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. In these alternative applications, the skilled artisan will appreciate that, in the context of such alternative applications, any use of the terms "reticle", "wafer" or "die" in this text should be considered as interchangeable with the more general terms "mask", "substrate" and "target portion", respectively. In addition, it should be noted that the method described herein may have many other possible applications in diverse fields such as language processing systems, self-driving cars, medical imaging and diagnosis, semantic segmentation, denoising, chip design, electronic design automation, etc. The present method may be applied in any fields where quantifying uncertainty in machine learning model predictions is advantageous.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

A patterning device may comprise, or may form, one or more design layouts. The design layout may be generated utilizing CAD (computer-aided design) programs. This process is often referred to as EDA (electronic design automation). Most CAD programs follow a set of predetermined design rules in order to create functional design layouts/patterning devices. These rules are set based processing and design limitations. For example, design rules define the space tolerance between devices (such as gates, capacitors, etc.) or interconnect lines, to ensure that the devices or lines do not interact with one another in an undesirable way. One or more of the design rule limitations may be referred to as a "critical dimension" (CD). A critical dimension of a device can be defined as the smallest width of a line or hole, or the smallest space between two lines or two holes. Thus, the CD regulates the overall size and density of the designed device. One of the goals in device fabrication is to faithfully reproduce the original design intent on the substrate (via the patterning device).

The term "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective; binary, phase-shifting, hybrid, etc.), examples of other such patterning devices include a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic means. Examples of other such patterning devices also include a programmable LCD array. An example of such a construction is given in U.S. Pat. No. 5,229,872, which is incorporated herein by reference.

As a brief introduction, FIG. 1 illustrates an exemplary lithographic projection apparatus 10A. Major components are a radiation source 12A, which may be a deep-ultraviolet (DUV) excimer laser source or other type of source including an extreme ultra violet (EUV) source (as discussed above, the lithographic projection apparatus itself need not have the radiation source), illumination optics which, for example, define the partial coherence (denoted as sigma) and which may include optics 14A, 16Aa and 16Ab that shape radiation from the source 12A; a patterning device 18A; and transmission optics 16Ac that project an image of the patterning device pattern onto a substrate plane 22A. An adjustable filter or aperture 20A at the pupil plane of the projection optics may restrict the range of beam angles that impinge on the substrate plane 22A, where the largest possible angle defines the numerical aperture of the projection optics NA=n sin($\Theta_{max}$), wherein n is the refractive index of the media between the substrate and the last element of the projection optics, and $\Theta_{max}$ is the largest angle of the beam exiting from the projection optics that can still impinge on the substrate plane 22A.

In a lithographic projection apparatus, a source provides illumination (i.e. radiation) to a patterning device and projection optics direct and shape the illumination, via the patterning device, onto a substrate. The projection optics may include at least some of the components 14A, 16Aa, 16Ab and 16Ac. An aerial image (AI) is the radiation intensity distribution at substrate level. A resist model can be used to calculate the resist image from the aerial image, an example of which can be found in U.S. Patent Application Publication No. US 2009-0157630, the disclosure of which is hereby incorporated by reference in its entirety. The resist model is related only to properties of the resist layer (e.g., effects of chemical processes that occur during exposure, post-exposure bake (PEB) and development). Optical properties of the lithographic projection apparatus (e.g., properties of the illumination, the patterning device and the projection optics) dictate the aerial image and can be defined in an optical model. Since the patterning device used in the lithographic projection apparatus can be changed, it is desirable to separate the optical properties of the patterning device from the optical properties of the rest of the lithographic projection apparatus including at least the source and the projection optics. Details of techniques and models used to transform a design layout into various lithographic images (e.g., an aerial image, a resist image, etc.), apply OPC using those techniques and models and evaluate performance (e.g., in terms of process window) are described in U.S. Patent Application Publication Nos. US 2008-0301620, 2007-0050749, 2007-0031745, 2008-0309897, 2010-0162197, and 2010-0180251, the disclosure of each being hereby incorporated by reference in its entirety.

It is often desirable to be able computationally determine how a patterning process would produce a desired pattern on a substrate. Thus, simulations may be provided to simulate one or more parts of the process. For example, it is desirable to be able to simulate the lithography process of transferring the patterning device pattern onto a resist layer of a substrate as well as the yielded pattern in that resist layer after development of the resist.

Figure 2:
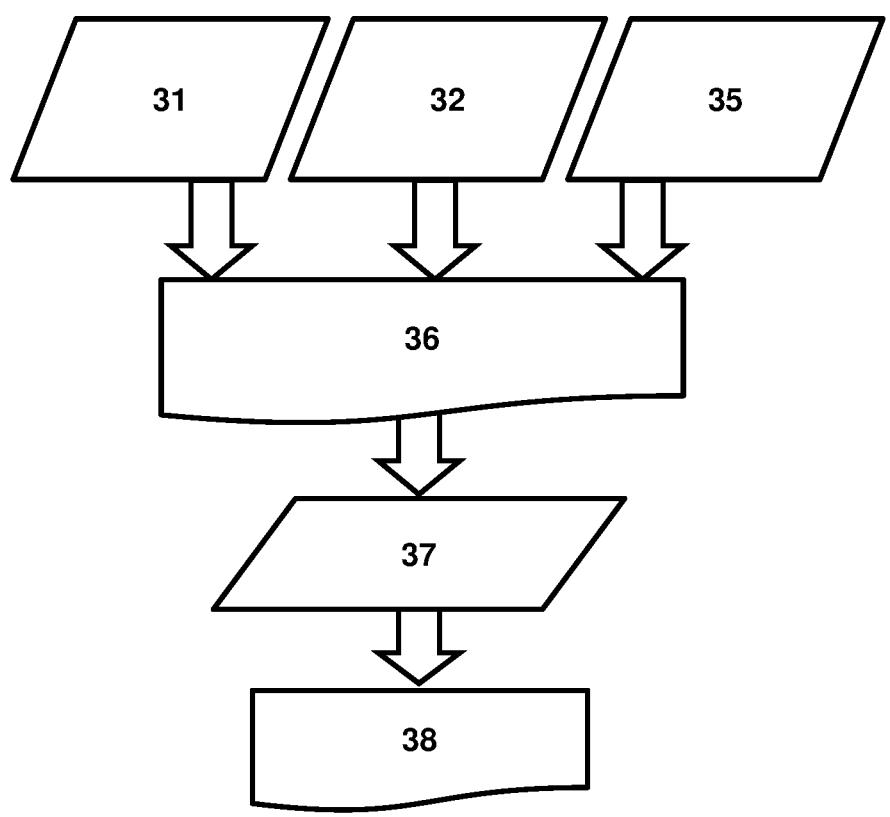
FIG. 2 illustrates an exemplary flow chart for simulating lithography in a lithographic projection apparatus, according to an embodiment.

An exemplary flow chart for simulating lithography in a lithographic projection apparatus is illustrated in FIG. 2. An illumination model 31 represents optical characteristics (including radiation intensity distribution and/or phase distribution) of the illumination. A projection optics model 32 represents optical characteristics (including changes to the radiation intensity distribution and/or the phase distribution caused by the projection optics) of the projection optics. A design layout model 35 represents optical characteristics (including changes to the radiation intensity distribution and/or the phase distribution caused by a given design layout) of a design layout, which is the representation of an arrangement of features on or formed by a patterning device. An aerial image 36 can be simulated using the illumination model 31, the projection optics model 32, and the design layout model 35. A resist image 38 can be simulated from the aerial image 36 using a resist model 37. Simulation of lithography can, for example, predict contours and/or CDs in the resist image.

More specifically, illumination model 31 can represent the optical characteristics of the illumination that include, but are not limited to, NA-sigma (σ) settings as well as any particular illumination shape (e.g. off-axis illumination such as annular, quadrupole, dipole, etc.). The projection optics model 32 can represent the optical characteristics of the of the projection optics, including, for example, aberration, distortion, a refractive index, a physical size or dimension, etc. The design layout model 35 can also represent one or more physical properties of a physical patterning device, as described, for example, in U.S. Pat. No. 7,587,704, which is incorporated by reference in its entirety. Optical properties associated with the lithographic projection apparatus (e.g., properties of the illumination, the patterning device and the projection optics) dictate the aerial image. Since the patterning device used in the lithographic projection apparatus can be changed, it is desirable to separate the optical properties of the patterning device from the optical properties of the rest of the lithographic projection apparatus including at least the illumination and the projection optics (hence design layout model 35).

The resist model 37 can be used to calculate the resist image from the aerial image, an example of which can be found in U.S. Pat. No. 8,200,468, which is hereby incorporated by reference in its entirety. The resist model is typically related to properties of the resist layer (e.g., effects of chemical processes which occur during exposure, post-exposure bake and/or development).

The objective of the simulation is to accurately predict, for example, edge placements, aerial image intensity slopes and/or CDs, which can then be compared against an intended design. The intended design is generally defined as a pre-OPC design layout which can be provided in a standardized digital file format such as GDSII, OASIS or other file format.

From the design layout, one or more portions may be identified, which are referred to as "clips". In an embodiment, a set of clips is extracted, which represents the complicated patterns in the design layout (typically about 50 to 1000 clips, although any number of clips may be used). As will be appreciated by those skilled in the art, these patterns or clips represent small portions (e.g., circuits, cells, etc.) of the design and especially the clips represent small portions for which particular attention and/or verification is needed. In other words, clips may be the portions of the design layout or may be similar or have a similar behavior of portions of the design layout where critical features are identified either by experience (including clips provided by a customer), by trial and error, or by running a full-chip simulation. Clips often contain one or more test patterns or gauge patterns. An initial larger set of clips may be provided a priori by a customer based on known critical feature areas in a design layout which require particular image optimization. Alternatively, in another embodiment, the initial larger set of clips may be extracted from the entire design layout by using some kind of automated (such as, machine vision) or manual algorithm that identifies the critical feature areas.

In some examples, the simulation and modeling can be used to configure one or more features of the patterning device pattern (e.g., performing optical proximity correction), one or more features of the illumination (e.g., changing one or more characteristics of a spatial/angular intensity distribution of the illumination, such as changing a shape), and/or one or more features of the projection optics (e.g., numerical aperture, etc.). Such configuration can be generally referred to as, respectively, mask optimization, source optimization, and projection optimization. Such optimization can be performed on their own, or combined in different combinations. One such example is source-mask optimization (SMO), which involves the configuring of one or more features of the patterning device pattern together with one or more features of the illumination. The optimization techniques may focus on one or more of the clips. The optimizations may use the machine learning model described herein to predict values of various parameters (including images, etc.).

In an embodiment, an optimization process of a system may be represented as a cost function. The optimization process may comprise finding a set of parameters (design variables) of the system that minimizes the cost function. The cost function can have any suitable form depending on the goal of the optimization. For example, the cost function can be weighted root mean square (RMS) of deviations of certain characteristics (evaluation points) of the system with respect to the intended values (e.g., ideal values) of these characteristics. The cost function can also be the maximum of these deviations (i.e., worst deviation). The term "evaluation points" should be interpreted broadly to include any characteristics of the system. The design variables of the system can be confined to finite ranges and/or be interdependent due to practicalities of implementations of the system. In the case of a lithographic projection apparatus, the constraints are often associated with physical properties and characteristics of the hardware such as tunable ranges, and/or patterning device manufacturability design rules. The evaluation points can include physical points on a resist image on a substrate, as well as non-physical characteristics such as dose and focus.

In an embodiment, illumination model 31, projection optics model 32, design layout model 35, resist model 37, an SMO model, and/or other models associated with and/or included in an integrated circuit manufacturing process may be an empirical model that performs the operations of the method described herein. The empirical model may predict outputs based on correlations between various inputs (e.g., one or more characteristics of a mask or wafer image, one or more characteristics of a design layout, one or more characteristics of the patterning device, one or more characteristics of the illumination used in the lithographic process such as the wavelength, etc.). Note that for the reticle contamination case: what is measured by the system is a high speed estimate of particle contamination on the reticle top-site or the pellicle, and the 'ground truth' is a, usually much slower, but accurate, off-line measurement of the particles.

As an example, the empirical model may be a prediction model, a machine learning model, and/or any other parameterized model. In an embodiment, the prediction and/or machine learning model (for example) may be and/or include mathematical equations, algorithms, plots, charts, networks (e.g., neural networks), and/or other tools and machine learning model components. For example, the prediction and/or machine learning model may be and/or include one or more neural networks having an input layer, an output layer, and one or more intermediate or hidden layers. In an embodiment, the one or more neural networks may be and/or include deep neural networks (e.g., neural networks that have one or more intermediate or hidden layers between the input and output layers).

As an example, the one or more neural networks may be based on a large collection of neural units (or artificial neurons). The one or more neural networks may loosely mimic the manner in which a biological brain works (e.g., via large clusters of biological neurons connected by axons). Each neural unit of a neural network may be connected with many other neural units of the neural network. Such connections can be enforcing or inhibitory in their effect on the activation state of connected neural units. In an embodiment, each individual neural unit may have a summation function that combines the values of all its inputs together. In an embodiment, each connection (or the neural unit itself) may have a threshold function such that a signal must surpass the threshold before it is allowed to propagate to other neural units. These neural network systems may be self-learning and trained, rather than explicitly programmed, and can perform significantly better in certain areas of problem solving, as compared to traditional computer programs. In an embodiment, the one or more neural networks may include multiple layers (e.g., where a signal path traverses from front layers to back layers). In an embodiment, back propagation techniques may be utilized by the neural networks, where forward stimulation is used to reset weights on the "front" neural units. In an embodiment, stimulation and inhibition for the one or more neural networks may be freer flowing, with connections interacting in a more chaotic and complex fashion. In an embodiment, the intermediate layers of the one or more neural networks include one or more convolutional layers, one or more recurrent layers, and/or other layers.

The one or more neural networks may be trained (i.e., whose parameters are determined) using a set of training data. The training data may include a set of training samples. Each sample may be a pair comprising an input object (typically a vector, which may be called a feature vector) and a desired output value (also called the supervisory signal). A training algorithm analyzes the training data and adjusts the behavior of the neural network by adjusting the parameters (e.g., weights of one or more layers) of the neural network based on the training data. For example, given a set of N training samples of the form $\{(x_1, y_1), (x_2, y_2), \ldots, (x_N, y_N)\}$ such that $x_i$ is the feature vector of the i-th example and $y_i$ is its supervisory signal, a training algorithm seeks a neural network g: X→Y, where X is the input space and Y is the output space. A feature vector is an n-dimensional vector of numerical features that represent some object (e.g., a wafer design as in the example above, or the image collected by an inline reticle contamination measurement device, and y is the actual size determined by the slow, but accurate off-line reticle contamination measurement system). The vector space associated with these vectors is often called the feature space. After training, the neural network may be used for making predictions using new samples.

Neural networks may be trained by minimizing a given cost function and/or trained in other ways. For example, Gradient Descent is a well-known, iterative method, where iteration takes place over all available data. Depending on the neural network, training may require thousands of iteration loops (or more) before optimum model parameters are determined. Gradient Descent can be and or include Stochastic Gradient Descent, where calculations are performed for each individual training sample (e.g., each process/performance data pair) in series (e.g., one after another), in small (but noisy) steps. This may result in a relatively accurate trained model, but, with large training data-sets, training may take a long period of time. Gradient Descent can also be and/or include Batch Gradient Descent, where calculations for training sample pairs are performed simultaneously. This may result in a smoother convergence of the model (e.g., due to averaging), and parallelism can be applied. However, Batch Gradient Descent requires all data to be present and, for performance, to fit in an electronic memory (which may be a problem for large data-sets). Gradient Descent can also be and/or include Mini-batch Gradient Descent, where calculations are performed for one subset (mini-batch) of training process/performance data pairs at a time. With Mini-batch Gradient Descent, a training dataset is split into mini-batches. Looping takes place over all mini-batches and this is repeated until the optimum parameters are determined.

With prior prediction models generated and/or trained by service providers and/or other centralized systems, training data is collected from remote systems (e.g. associated with customers of the service provider) on a central system (e.g. associated with the service provider). Unintentional dissemination of information from the remote systems was often a concern. The present systems and methods were developed to address these and other disadvantages.

The present systems and methods are configured to determine and distribute a prediction model, with the model parameters, to different (e.g., customer) systems. Individual (e.g., customer) systems may train (or retrain) the distributed model with one mini-batch of local training data. Resulting locally updated model parameters (e.g., weights, biases, and/or other model parameters) are returned to the central (e.g. service provider) system, where some form of aggregation (e.g., averaging and/or other aggregation) takes place. The aggregated model parameters are redistributed to the different customer systems, and the process is repeated until optimum model parameters are determined.

As an example, the present systems and methods may facilitate distribution of a model and the model parameters (e.g., weights, biases, etc.) from a service provider to customers. Each customer owns his own data (which may be considered a mini-batch). The customer performs one step of the Gradient Descent, using only his own training data. The resulting updated model parameters (e.g., weights, biases, etc.) are returned to the service provider. Since the customer data is much larger than the number of model parameters, details of the customer data are hidden/obscured in the updated model parameters. Once training is complete, the present systems and methods are configured such that the service provider is able to deliver an optimal model, trained on the available data, with the model able to be shared among customers, without (from the service provider point of view) needing direct access to customer data.

Figure 3:
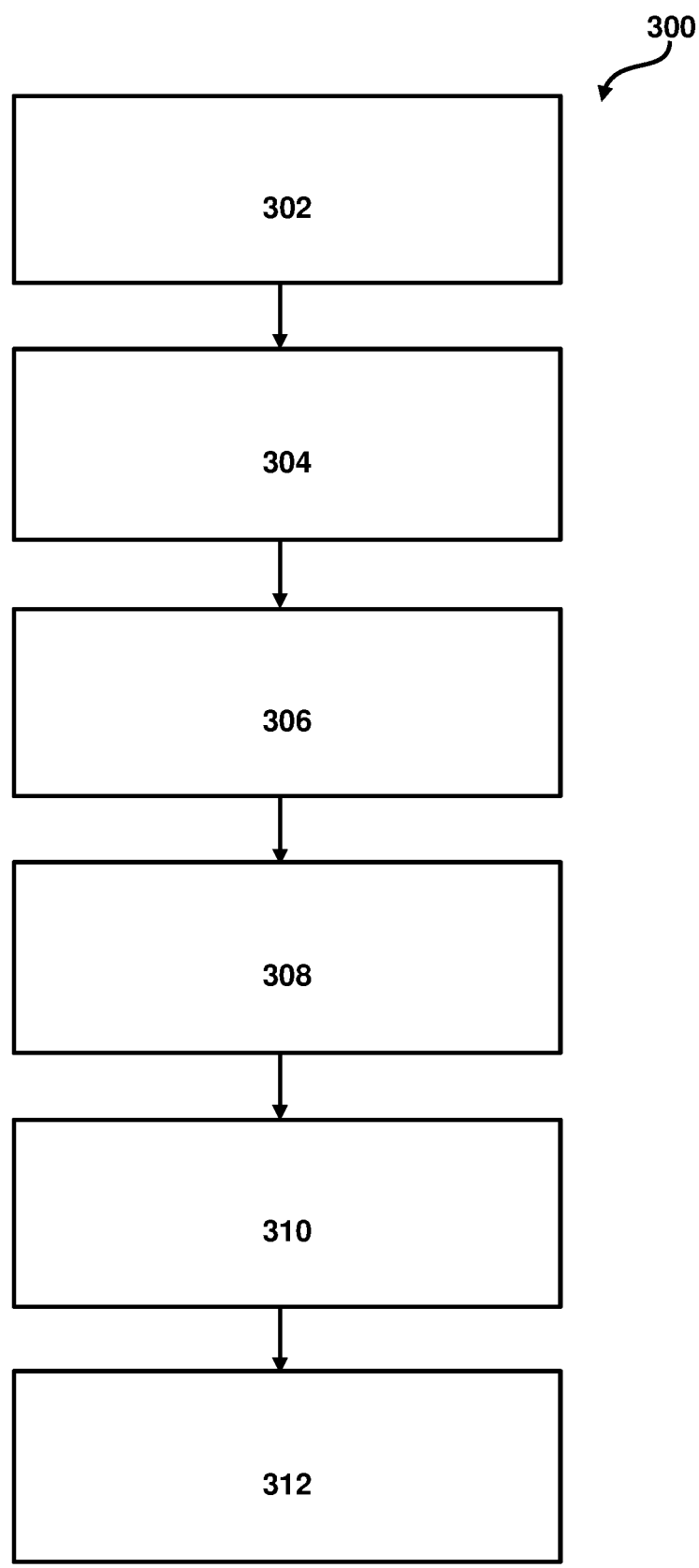
FIG. 3 illustrates a summary of operations of a present method for adjusting a prediction model used for enhancing a lithography process, according to an embodiment.

FIG. 3 illustrates a summary of operations of a present method 300 for adjusting a prediction model used for enhancing a lithography process. Method 300 comprises providing 304 an initial prediction model comprising a plurality of model parameters to one or more remote locations. In some embodiments, the one or more remote locations comprise one or more facility locations remote from a facility location where the initial prediction model is generated and trained, updated model parameters are received, aggregated updated model parameters are determined, and an adjusted prediction model is determined (e.g., as described below).

In some embodiments, the prediction model is a neural network and/or other prediction models. In an embodiment, the plurality of model parameters comprise a weight, a bias, and/or other parameters of the neural network. Providing the initial prediction model comprises transmitting and/or otherwise distributing the initial prediction model to the one or more remote locations. Transmitting and/or otherwise distributing the initial predication model may include emailing, texting, and/or other electronic messaging of the model, providing the model via a website, storing and/or providing access to the model via cloud based storage media, storing the model on non-transitory storage media and physically transferring the non-transitory storage media, and/or other transmission or distribution.

At the one or more remote locations, the initial prediction model is trained and/or retrained with local data. The local data comprises process data and corresponding performance data associated with a remote location. The process data and corresponding performance data may comprise data for lithography modeling and/or manufacturing processes, for example, associated with the remote locations, and/or other data. In some embodiments, first local data may be associated with a first remote location, second local data may be associated with a second remote location, and so on. In some embodiments (e.g., as described herein), the remote locations are associated with customers of a service provider, with the service provider providing copies of the initial prediction model to individual customers. Retraining the initial prediction model with local data may comprise providing the local data as input to the prediction model and/or other training at the individual participating remote locations (e.g., customers). For example, the initial prediction model may be retrained differently at each of several different remote locations. This retraining may occur in parallel, for example, at the different remote locations because each remote location uses their own local data for the retraining.

In an embodiment, prior to providing the initial prediction model to the one or more remote locations, the initial prediction model is generated and/or trained 302 using global data. The global data comprises a larger data set than the local data, a different data set (not necessarily larger) than the local data, and/or other data. The global data (process and corresponding performance data) may be associated with the service provider, may be related to (but not the same as) data from one or more of the remote locations, may be related to and/or associated with data from more than one of the remote locations, and/or include other data. The global data may comprise process data and corresponding performance data associated with, related to, and/or representative of, several remote locations, for example. The process data and corresponding performance data may comprise data for lithography modeling and/or manufacturing processes, for example, associated with, related to, and/or representative of, the several remote locations, and/or other data. In some embodiments, the global data is or is based on synthetic data, which is determined based on expected process behavior. In some embodiments, the global data may be seed data and/or model parameters (e.g., in general, randomly chosen weights). In such embodiments, the actual learning may only take place at the customers (possibly, if available, combined with relevant training data available at the service provider). For a reticle contamination case example, the service provider may collect particle data from an internal reticle imaging system, and collect details from the physical particle using a microscope. Customers may also do this locally, in parallel, in their own processes. In this example, the service provider could start with training on their own local data, and refine data on the combined customer data. If this data is not locally available at the service provider, the first model distributed to the customers may have 'random weights' (e.g., to establish a starting point), for example.

The training (or retraining) of the initial prediction model with local data at the one or more remote locations comprises retraining the initial prediction model to update at least one model parameter. For example, the initial prediction model may be trained (or retrained) with local data at the one or more remote locations such that the weights (or a weight), the biases (or a bias), and/or other parameters are updated based on the local data at each of the one or more remote locations. Training and/or retraining the initial prediction model may comprise providing the local data to the initial prediction model as input to the initial prediction model (e.g., as described above). The initial prediction model may operate (e.g., as described above related to neural networks) to learn to better predict the performance data based on the corresponding process data provided to the prediction model. Learning to better predict performance may comprise iteratively updating one or more of the model parameters, and determining whether the update resulted in a better or a worse prediction of the known performance data, for example.

Method 300 comprises receiving 306 the at least one updated model parameter from each of the one or more remote locations where the initial prediction model was trained (or retrained). This may include receiving the updated weights, biases, and/or other parameters from each of the one or more remote locations. Continuing with the example above, updated weights, biases, and/or other parameters may be received from the first remote location (customer), the second remote location (customer) and so on.

Method 300 comprises determining 308 aggregated updated model parameters based on the at least one updated model parameter received from the one or more remote locations. This may include determining aggregated updated weights, biases, and/or other parameters received from each of the one or more remote locations, for example. In an embodiment, determining the aggregated updated model parameters comprises averaging and/or other aggregation of corresponding model parameters. For example, weights are averaged with other corresponding weights, and biases are averaged with other corresponding biases, etc., received from each of the one or more remote locations. As a more specific example, updated first and second weights may be determined at each of several remote locations (e.g., customers) such that several values of the first weight and several values of the second weight are received. Responsive to receipt, the several values of the first weight may be averaged (and/or otherwise aggregated) together and, separately, the several values of the second weight may be averaged (and/or otherwise aggregated) together. This process may be repeated for any number of weights, biases, and/or other model parameters.

In some embodiments, method 300 comprises adjusting 310 the initial prediction model based on the aggregated updated model parameters. This may include adjusting, for example, an initial neural network based on aggregated updated weights, biases, and/or other parameters, for example. In some embodiments, adjusting 310 the initial prediction model comprises substituting the aggregated updated model parameters for prior model parameters of the prediction model. In some embodiments, one, some, or all of the aggregated updated model parameters are substituted. In some embodiments, method 300 comprises automatically substituting one, some, or all of the aggregated updated model parameters. In some embodiments, method 300 comprises facilitating user selection and/or other indication (e.g., via a user interface as described herein) of which aggregated updated model parameters to substitute In some embodiments, adjusting 310 the initial prediction model may be performed by a service provider, for example. In such embodiments, the service provider may adjust the initial prediction model and the provide the adjusted prediction model to the remote (e.g., customer) locations.

In some embodiments, method 300 comprises iteratively providing 312 the adjusted prediction model (and/or the aggregated updated model parameters) to the one or more remote locations (e.g., customers), receiving the updated model parameters (e.g., from the customers), determining the aggregated updated model parameters, and readjusting the adjusted prediction model until a stop condition is satisfied. In some embodiments, the stop condition comprises convergence of the readjusted prediction model. In some embodiments, the convergence of the readjusted prediction model comprises an amount of change in the aggregated updated model parameters being within a threshold amount of change and/or any other model convergence criteria.

As a brief summary, in some embodiments, the generating and training of the initial prediction model is performed by a service provider. Providing the initial prediction model to the one or more remote locations is performed by the service provider. The remote locations and the local data are associated with customers of the service provider. The updated model parameters are received from each of the one or more remote locations by the service provider. The aggregated updated model parameters received from each of the one or more remote locations are determined by the service provider. The adjusted prediction model is determined by the service provider (and/or individual customers) based on the aggregated updated model parameters. The local data is kept local to each of the one or more remote locations (e.g., customers) and is not shared with (1) a location (e.g., a service provider) that provides the initial prediction model, the updated model parameters are received, the aggregated updated model parameters are determined, and the adjusted prediction model is determined, or (2) other ones of the remote locations (e.g., customers).

In some embodiments, the adjusted prediction model (e.g., neural network) is operable to enhance a lithography process (e.g., as described above), and/or have other applications. For example, the adjusted prediction model may be better able to predict performance data for a photolithography process given a set of process data. The prediction model may be iteratively adjusted to enhance the accuracy of the photolithography process predictions. These predictions may be used to determine and/or adjust process parameters, determine and/or adjust feature designs, determine an order of manufacturing operations, determine which manufacturing equipment to use for a manufacturing process, and/or facilitate other enhancements.

Figure 4A:
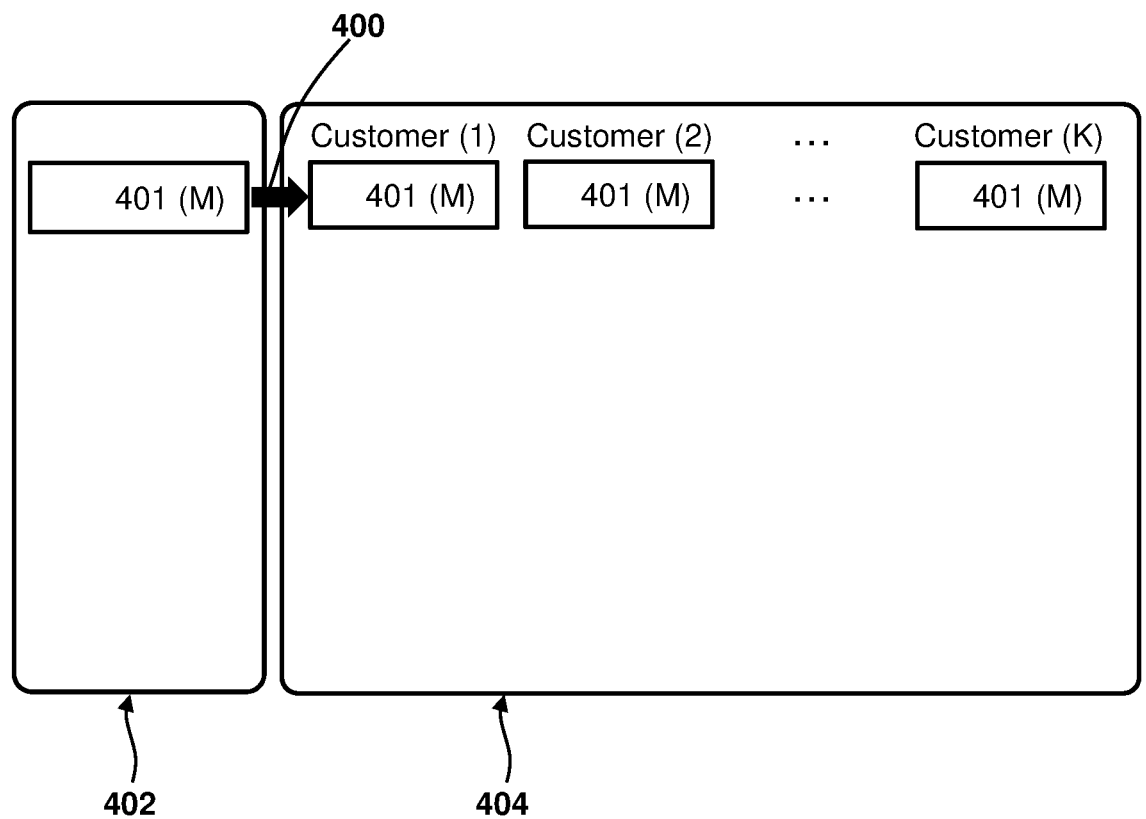
FIG. 4A illustrates providing and/or otherwise distributing a prediction model from a service provider to customers, according to an embodiment.

By way of a non-limiting example, FIG. 4A-4E illustrate providing an initial prediction model to remote locations, receiving the updated model parameters from the remote locations, determining the aggregated updated model parameters, and adjusting the initial prediction model. FIG. 4A illustrates providing and/or otherwise distributing 400 a prediction model 401 (M) from a service provider 402 to one or more customers 404 (e.g., remote locations). As shown in FIG. 4A, prediction model 401 (M) is distributed to a first customer "Customer (1)", a second customer "Customer (2)", . . . and a Kth customer "Customer (K)". The same model 401 (M) may be provided to each customer 404. As described above, providing prediction model 401 (M) comprises transmitting and/or otherwise distributing the prediction model 401 (M) to the one or more customers 404. Transmitting and/or otherwise distributing the initial predication model may include emailing, texting, and/or other electronic messaging of the model, providing the model via a website, storing and/or providing access to the model via cloud based storage media, storing the model on non-transitory storage media and physically transferring the non-transitory storage media, and/or other transmission or distribution.

Figure 4B:
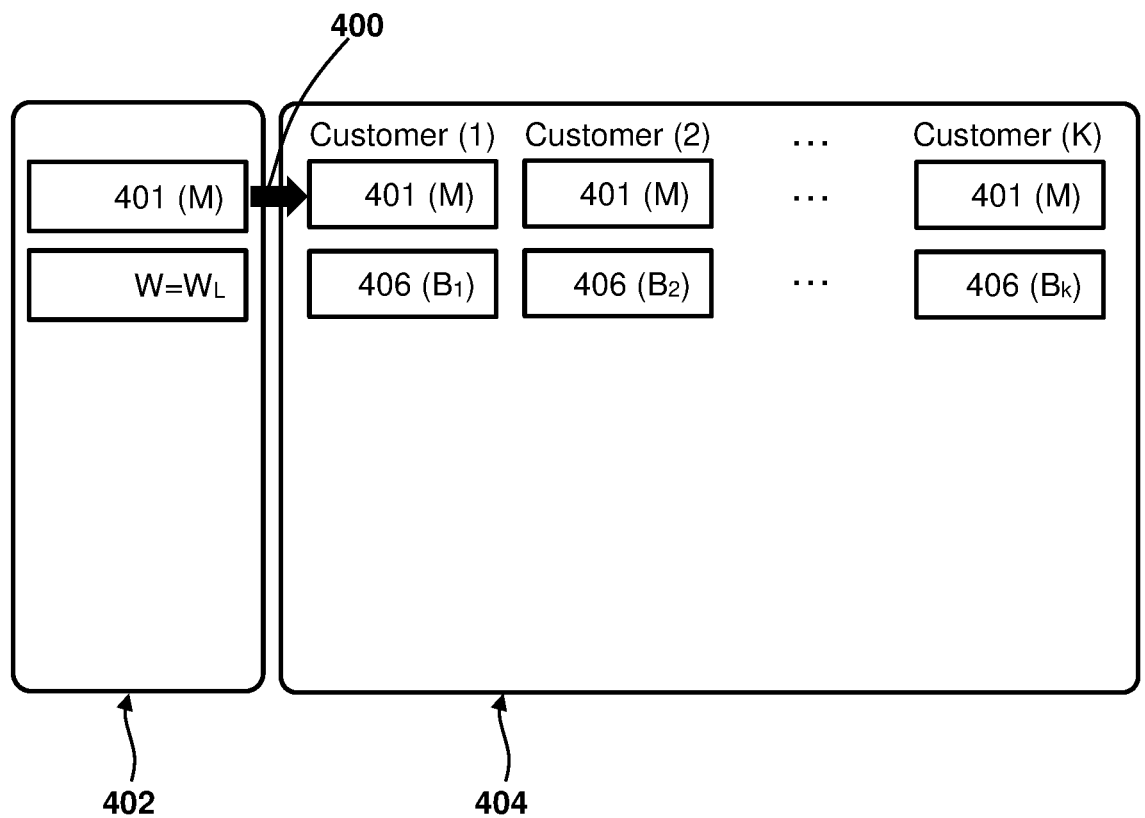
FIG. 4B illustrates how individual customers have their own local data, according to an embodiment.

FIG. 4B illustrates how individual customers 404 (e.g., customer 1, customer 2, . . . , customer K) have their own local data 406. The local data may comprise process data and corresponding performance data for lithography processes (for example) associated with the customers 404, and/or other data. For example, local data 406 (B1) is associated with customer 404 (1), local data 406 (B2) is associated with customer 404 (2), and . . . local data 406 (Bk) is associated with customer 404 (K). FIG. 4B also illustrates how service provider 402 distributes 400 a version of model 401 (M) having the latest (e.g., the most up to date and/or recently determined/aggregated) model parameters. In the example shown in FIG. 4B, the prediction model may be a neural network and the model parameters may include a weight (W). FIG. 4B illustrates how service provider 402 has the latest weights $W_L$ (e.g., $W=W_L$).

Figure 4C:
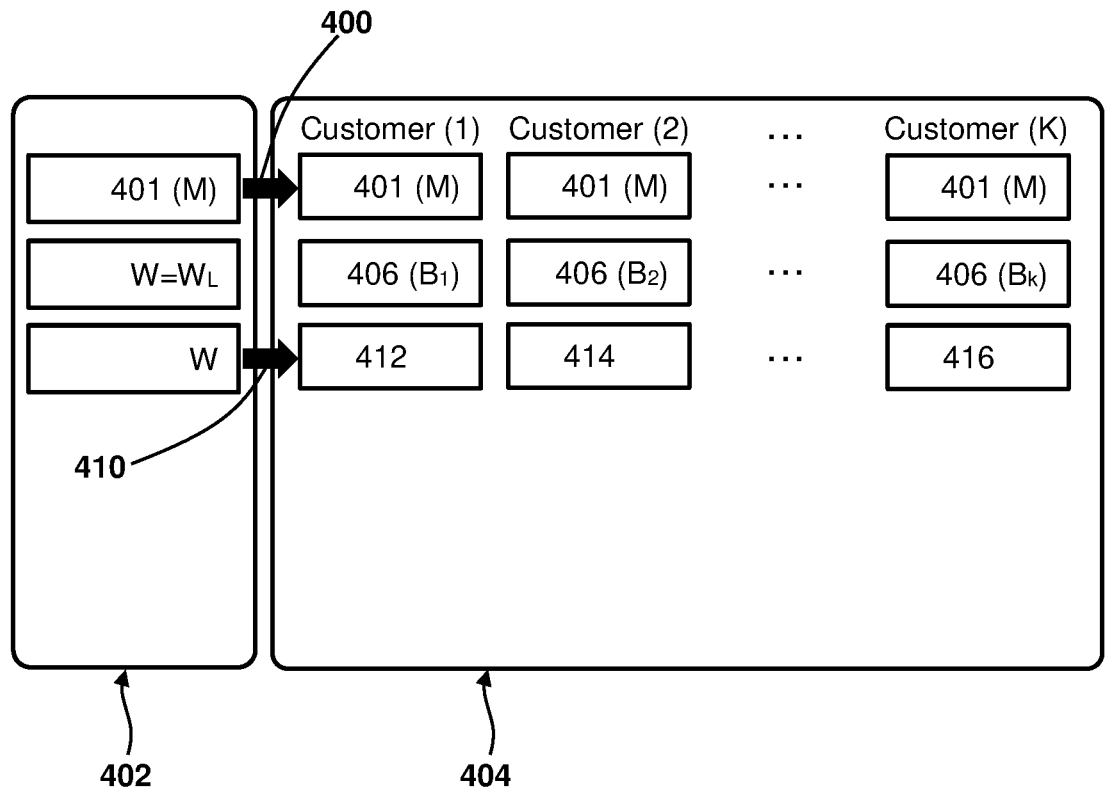
FIG. 4C illustrates distribution of a set of latest weights for a prediction model such as a neural network to customers, according to an embodiment.

FIG. 4C illustrates distribution 410 of the latest weights W for model 401 (M) (e.g., a prediction model such as a neural network) to customers 404 (1), 404 (2), . . . , and 404 (K). The same weights W are distributed 410 to each individual remote customer location. Individual customers 404 may load model 401 (M) with the latest weights W. For example, operations 412, 414, and 416 illustrate individual customers 404 (1, 2, . . . K) loading model 401 (M) with weights W. Weights W may be separately loaded into model 401 (M) (e.g., the local copy of model 401 (M)) at each individual remote customer location. In some embodiments, the latest weights W may be sent to the customers 404 in the same communication that includes model 401 (M) (e.g., with an initial distribution of model 401 M) and/or in a separate communication and/or transmission (e.g., after an iteration of receiving, aggregating, and updating the weights and/or other model parameters as described herein).

Figure 4D:
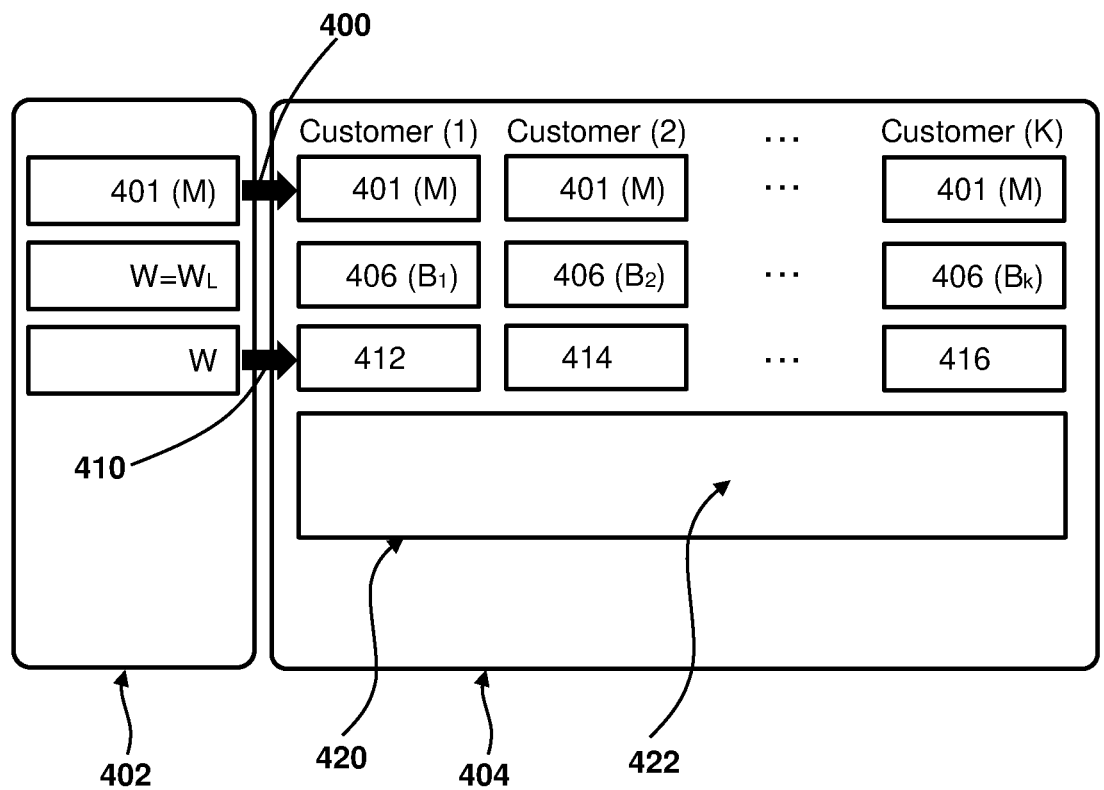
FIG. 4D illustrates training (and/or retraining) the prediction model at one or more remote customer locations with local data, according to an embodiment.

FIG. 4D illustrates training (and/or retraining) 420 model 401 (M) at the one or more remote customer (e.g., 404 (1), 404 (2), . . . 404 (K)) locations with local data 406 (e.g., B1, B2, . . . , Bk). The training (or retraining) of model 401 (M) with local data 406 at the one or more remote customer locations 404 comprises providing local data 406 to model 401 (M) at individual customer locations 404 and causing model 401 (M) to update at least one model parameter. For example, model 401 (M) may be trained (or retrained) with local data 406 at the one or more remote customer locations 404 such that the weights (or a weight), the biases (or a bias), and/or other parameters are updated based on local data 406 at each of the one or more remote customer locations 404. In some embodiments, the training (and/or retraining) comprises locally executing one step of a Gradient Descent (e.g., as described above) using only the local data 406 at a given remote customer location 404. One non-limiting example of the mathematics associated with execution of a step of a Gradient Descent may be as follows:

$$J_c^{(MB)}(w_L, b) = \frac{1}{|B_C|} \sum_{z \in B_c} J(w_L, b, x^{(z)}, y^{(z)})$$

$$w_{L+1} = W_L - a\nabla_w J^{(MB)}(W_L, b, x^{(P)}, y^{(P)})$$

FIG. 4D illustrates a placeholder 422 for where such mathematics may occur in the process. It should be noted that local data 406 from one remote customer location 404 is not shared with any other remote customer location 404, and/or service provider 402. Multiple separate Gradient Descent calculations are performed at the individual remote customer locations 404 in parallel.

Figure 4E:
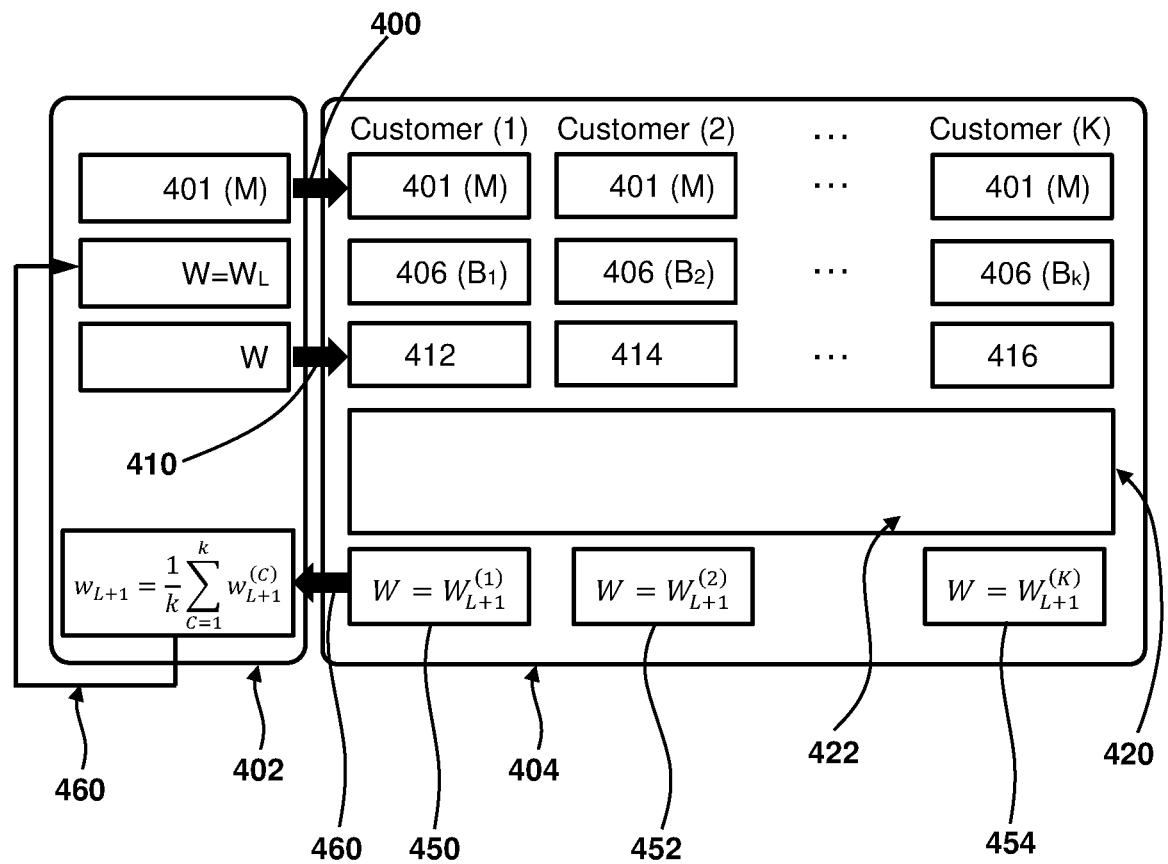
FIG. 4E illustrates determination of updated weights and/or other model parameters at individual remote customer locations, according to an embodiment.

FIG. 4E illustrates determination 450, 452, 454, of updated weights W and/or other model parameters at individual remote customer locations 404 (e.g., 404 (1), 404 (2), . . . , 404 (K)). The updated weights (in this example) are returned 460 to service provider 402. Service provider 402 aggregates 460 the updated weights. In the example shown in FIG. 4E, the aggregation comprises averaging. In some embodiments, aggregation of the updated weights may include determining aggregated updated weights, biases, and/or other parameters received from each of the one or more remote customer locations 404, for example. Determining the aggregated updated model parameters comprises averaging and/or other aggregation of corresponding model parameters (e.g., weights are averaged with weights, biases are averaged with biases, etc.) received from each of the one or more remote locations.

FIG. 4E also illustrates how the aggregated updated weights (in this example) become (are treated as) the latest weights $W_L$ and the operations shown in FIG. 4A-4E are repeated with these latest weights. The operations shown in FIG. 4A-4E may be iteratively repeated (e.g. with new latest weights) responsive to the model not converging after an individual iteration, for example. In some embodiments, the method further comprises adjusting the prediction model 401 (M) based on the aggregated updated model parameters (e.g., weights in this example). This may include adjusting, for example, an initial neural network based on aggregated updated weights, biases, and/or other parameters, for example.

Returning to FIG. 3, in some embodiments, training the initial prediction model (e.g., neural network) using global data (e.g., at operation 302) comprises training the initial prediction model with image data associated with a reticle or collector, and defect information associated with contamination or image performance. In some embodiments, the adjusted prediction model being operable to enhance the lithography process comprises the adjusted prediction model being used to recognize reticle contamination in the lithography process. In some embodiments, the adjusted prediction model being operable to enhance the lithography process comprises the adjusted prediction model being used to determine whether collector contamination is at an acceptable level for an exposure in the lithography process. Other examples, related to several different aspects of an integrated circuit fabrication process, and/or other processes, are contemplated. For example, in an embodiment, the method may comprise using the prediction model for predicting wafer geometry as part of a semiconductor manufacturing process. In an embodiment, the method may comprise using the prediction model for generating a predicted overlay as part of a semiconductor manufacturing process. These are examples only, and are not intended to be limiting.

Figure 5:
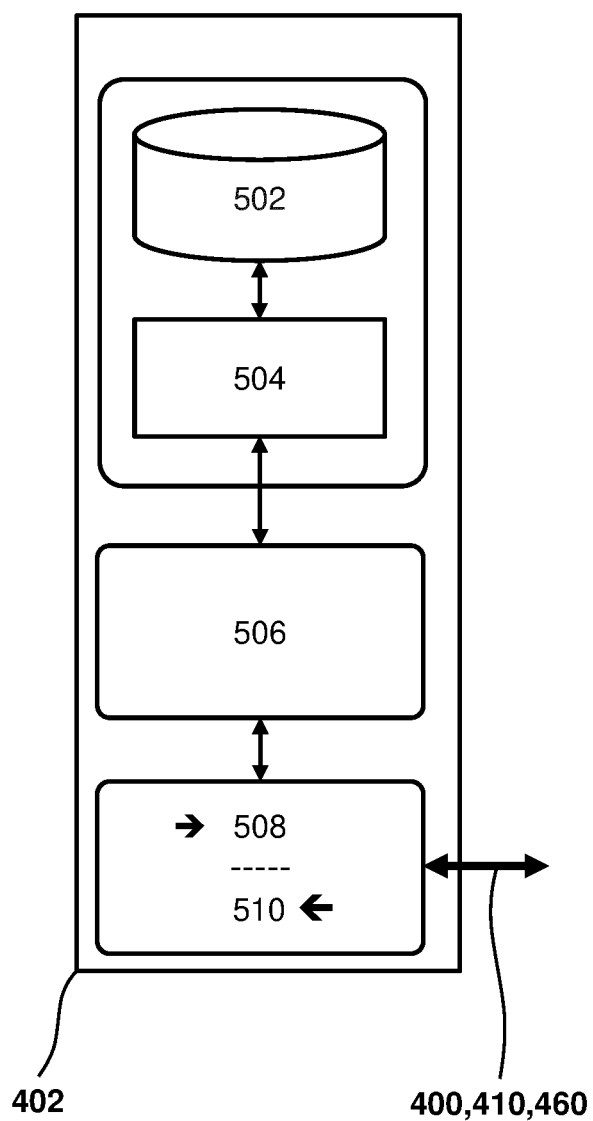
FIG. 5 illustrates a service provider where models and model parameters may be stored, a model server may be provided, sanity checks may be performed, and encryption/decryption may be performed, according to an embodiment.

FIG. 5 illustrates service provider 402 where models and model parameters may be stored 502, one or more model servers 504 (e.g., configured to facilitate provision of the model and/or the model parameters to the remote locations, aggregating the updated model parameters, adjusting the prediction model, etc.) may be provided, sanity checks 506 may be performed, and encryption 508/decryption 510 may be performed.

In some embodiments, method 300 (FIG. 3) comprises (e.g., at operation 304) encrypting 508 (FIG. 5) the provided initial prediction model and/or other versions of the prediction model, one or more model parameters, and/or other information. In some embodiments, encryption 508 is configured such that the training with local data occurs without decryption of the provided initial prediction model. In some embodiments, method 300 comprises (e.g., at operation 306) decrypting 510 (FIG. 5) the updated at least one model parameter received from each of the one or more remote locations. In some embodiments, encrypting 508 and/or decrypting 510 the information provided to and received from the one or more remote locations (e.g., customers) facilitates increased trust and/or confidence in users at the remote locations that local data will not be inadvertently shared with the service provider and/or other ones of the remote locations. In some embodiments, encrypting 508 and/or decrypting 510 the information provided to and received from the one or more remote locations facilitates increased trust and/or confidence in the service provider that a given prediction model may remain proprietary and will not be shared among, or reverse engineered by customers, for example.

In some embodiments, method 300 (FIG. 3) comprises performing a sanity check 506 (FIG. 5) on the provided initial prediction model and/or other versions of the prediction model, one or more model parameters, and/or other information. For example, in some embodiments, the method comprises performing a sanity check on one or more updated model parameters received from each of the one or more remote locations. In some embodiments, performing a sanity check may comprise generally determining whether a received value is within an expected range of values. For example, performing a sanity check may comprise determining whether an updated parameter value (e.g., a weight) is within an expected range of weights for a neural network. The expected range of values may correspond to an individual parameter such that there are different expected ranges for different parameters (e.g., different ranges for different weights, different biases, etc.) The expected ranges may be determined based on previous values for the model parameters, determined at manufacture, determined and/or adjust by users (e.g., via a user interface described herein), and/or by other methods. As other possible non-limiting examples of a sanity check, a customer may check to see whether a new version of a model actually improves, or a service provider can check convergence trends, etc. Other examples are contemplated.

Figure 6A:
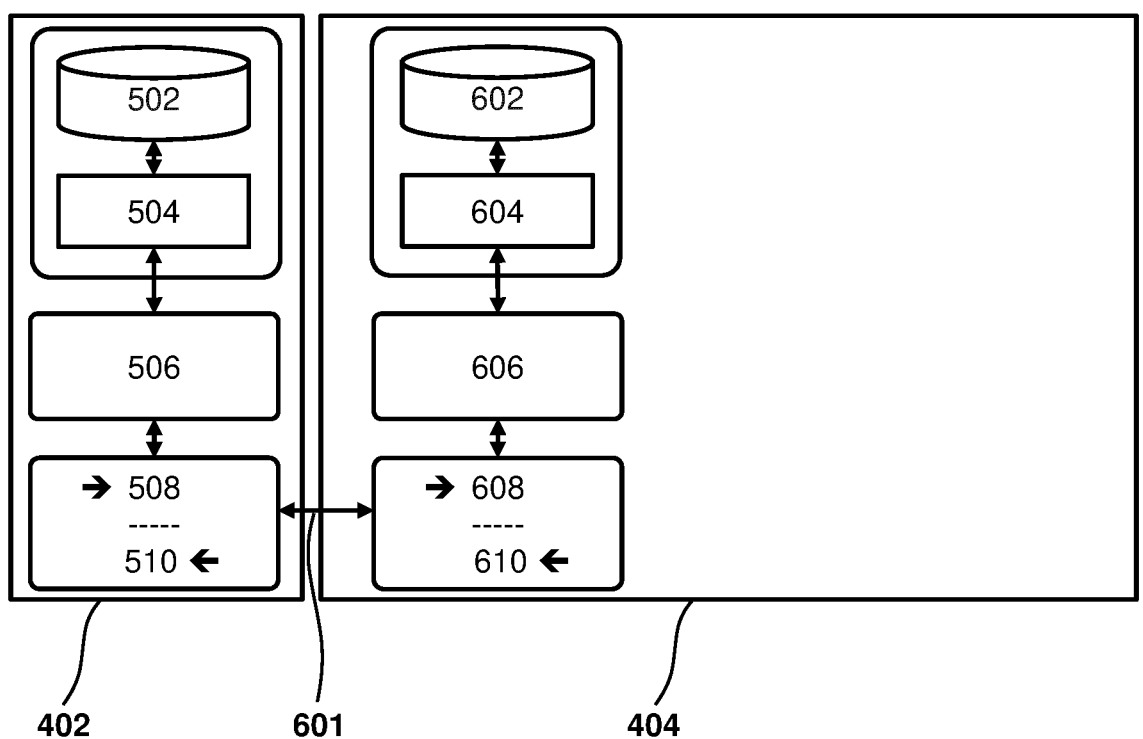
FIG. 6A illustrates a remote customer location where models and model parameters may be stored, one or more model servers may be provided, sanity checks may be performed, and decryption/encryption may be performed, according to an embodiment.

In some embodiments, encryption/decryption and/or sanity checks may be performed by a service provider as described above, and/or by a customer at remote location. For example, FIG. 6A illustrates a remote customer location 404 where models and model parameters may be stored 602, one or more model servers 604 (e.g., configured to facilitate receipt of the model and/or the model parameters at remote customer location 404, updating the model parameters, etc.) may be provided, sanity checks 606 may be performed (e.g., on incoming and/or outgoing data), and decryption 608/ encryption 610 may be performed. As shown in FIG. 6A, in some embodiments, a prediction model is provided to one or more model servers 604 at each of the one or more remote locations 404. In some embodiments, communications to and/or from a remote location 404 (e.g., a customer) concern only a model layout, model weights, and/or other information.

Figure 6B:
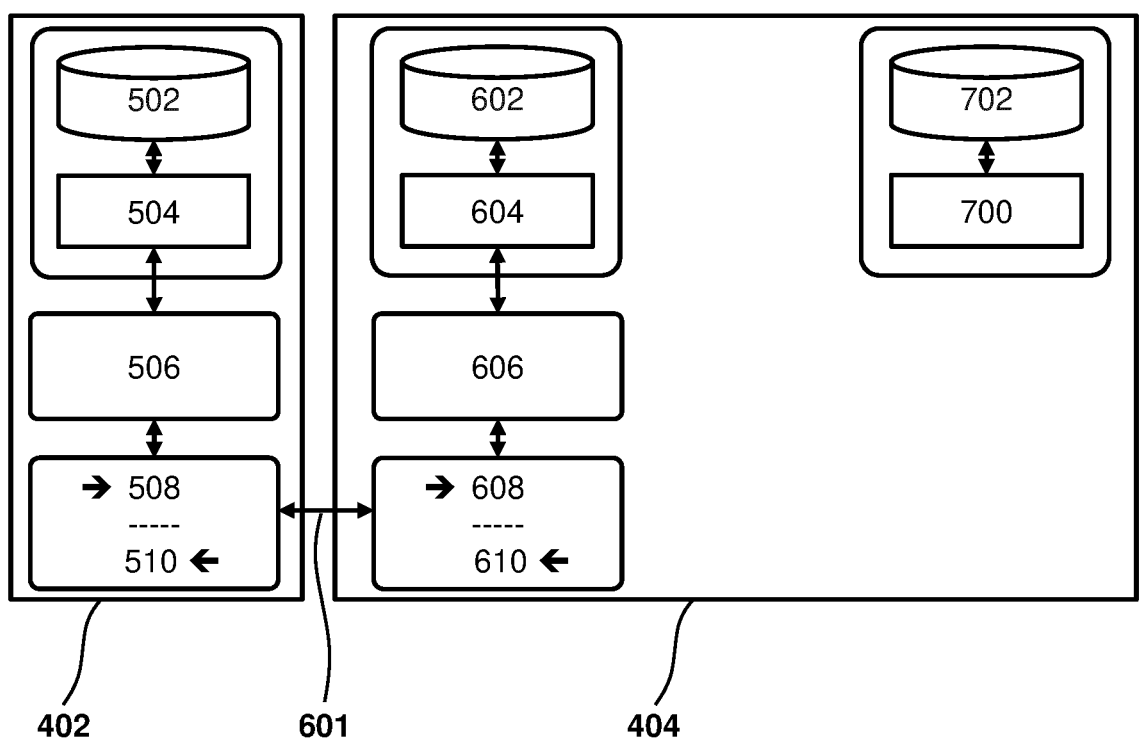
FIG. 6B illustrates a model server that is separate from a local data server at a given remote customer location, according to an embodiment.

In some embodiments, as shown in FIG. 6B, a given model server 604 is separate from a local data server 700 at a given remote customer location 404. FIG. 6B also illustrates local data storage 702 that is separate from model server 604. The data from local data storage 702 remains local to remote customer location 404 and is not shared with service provider 402 and/or other remote customer locations 404 for other customers. Local data storage 702 may store data and/or other data a customer (for example) wants to keep private and/or stored at a remote location 404. This data may include operational and/or process data, and/or other data that a customer does not want to share with service provider 402 and/or other remote locations 404.

Figure 7:
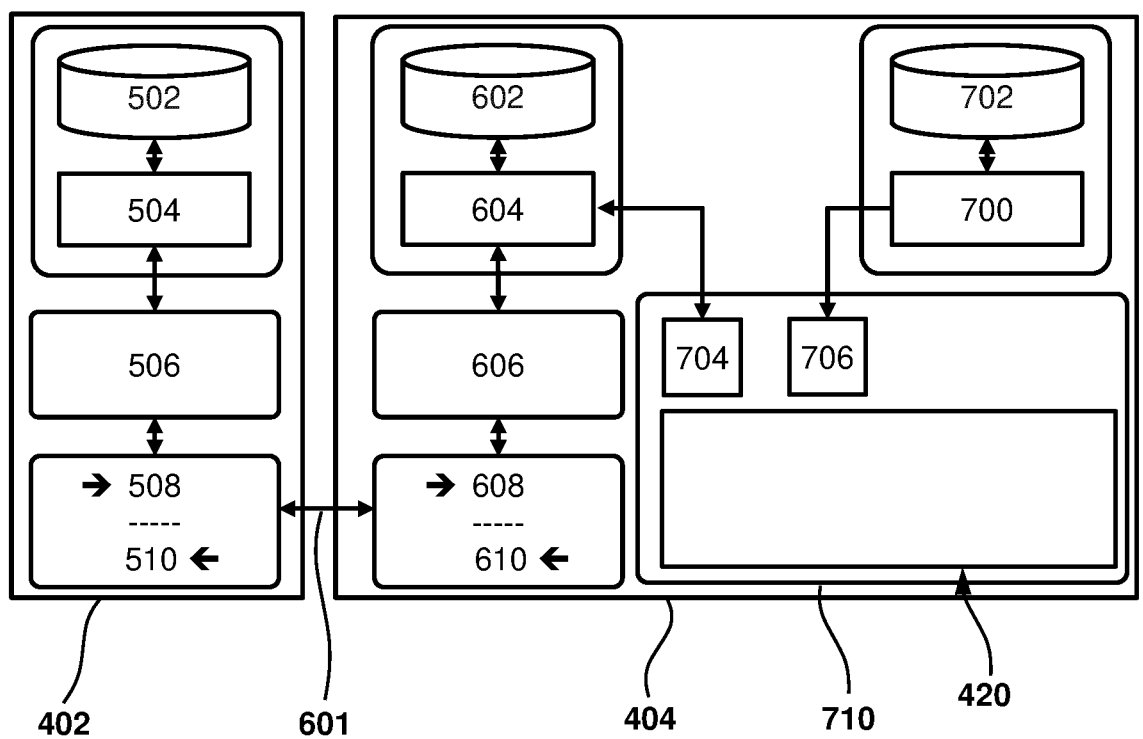
FIG. 7 illustrates how, when parameters (e.g., weights, biases, etc.) are received at a remote location from a service provider, the latest parameters are loaded into a local copy of the model with local operational data, the parameters are updated, and the updated parameters are sent back to the service provider, in accordance with an embodiment.

FIG. 7 illustrates how, when the latest parameters (e.g., weights, biases, etc.) are received at a remote location 404 from a service provider 402 (e.g., via communication 601), the latest parameters are loaded 704 into a local copy of the model (and/or a model sent from service provider 402 with and/or before the latest parameters), the parameters are updated, and the updated parameters are sent back to service provider 402 (e.g., via communication 601). The latest parameters may be loaded 704 into the local copy of the model by model server 604 and/or other components, for example. The latest parameters may be loaded 704 into the local copy of the model along with local operational data 706 from local data server 700, and/or other information.

As described above, updating the parameters may include training (or retraining) of the prediction model with local data 706 at the one or more remote locations 404. This training (or retraining) may be performed by a training server 710 and/or other components at remote location 404. comprises retraining the initial prediction model to update at least one model parameter. For example, the prediction model may be trained (or retrained) with local data 706 by executing a local gradient descent 420 at remote location 404 such that the weights (or a weight), the biases (or a bias), and/or other parameters are updated based on local data 706. This may occur at each of the one or more remote locations 404. Training and/or retraining the prediction model may comprise providing the local data to the initial prediction model as input to the initial prediction model (e.g., as described above). The prediction model may operate (e.g., as described above related to neural networks) to learn to better predict the performance data based on the corresponding process data provided to the prediction model. Learning to better predict performance may comprise iteratively updating one or more of the model parameters, and determining whether the update resulted in a better or a worse prediction of the known performance data, for example.

In some embodiments, the methods and/or operations shown and described in FIG. 3, FIG. 4A-4E, FIG. 5, FIG. 6A-6B, FIG. 7, and FIG. 8 comprise providing the initial prediction model to a first remote location where the initial prediction model is trained with local data such that weights, biases, and/or other parameters of the initial prediction model are updated based on the local data at the first remote location. The updated weights, biases, and/or other parameters may be received from the first remote location. These methods and/or operations may include adjusting the initial prediction model based on aggregated updated weights, biases, and/or other parameters received from the first remote location. These methods and/or operations may include providing the adjusted prediction model to a second remote location where the adjusted prediction model is retrained with local data such that the weights are reupdated based on the local data at the second remote location. These methods and/or operations may include receiving the reupdated weights from the second remote location; and readjusting the adjusted prediction model based on the reupdated weights received from the second remote location. In some embodiments, these methods and/or operations may comprise iteratively providing the readjusted prediction model to additional remote locations (e.g., the operations described above performed one by one), receiving the reupdated weights, and further adjusting the readjusted prediction model based on the reupdated weights.

In some embodiments, an initial prediction model (and/or any prediction model provided by a service provider) comprises a partially trained prediction model. The partially trained prediction model comprises a plurality of model parameters such that, after provision to a given remote location (e.g., customer), the training with local data comprises fully training the prediction model. In some embodiments, a user at the given remote location (e.g., customer) may determine, based on the fully trained prediction model, whether to communicate the updated at least one model parameter from the given remote location. For example, responsive to the user being satisfied with an accuracy of the fully trained prediction model, the user may decide that further iterations of the model are unnecessary for the given remote location, and decide not to communicate the updated model parameters back to the service provider.

Figure 8:
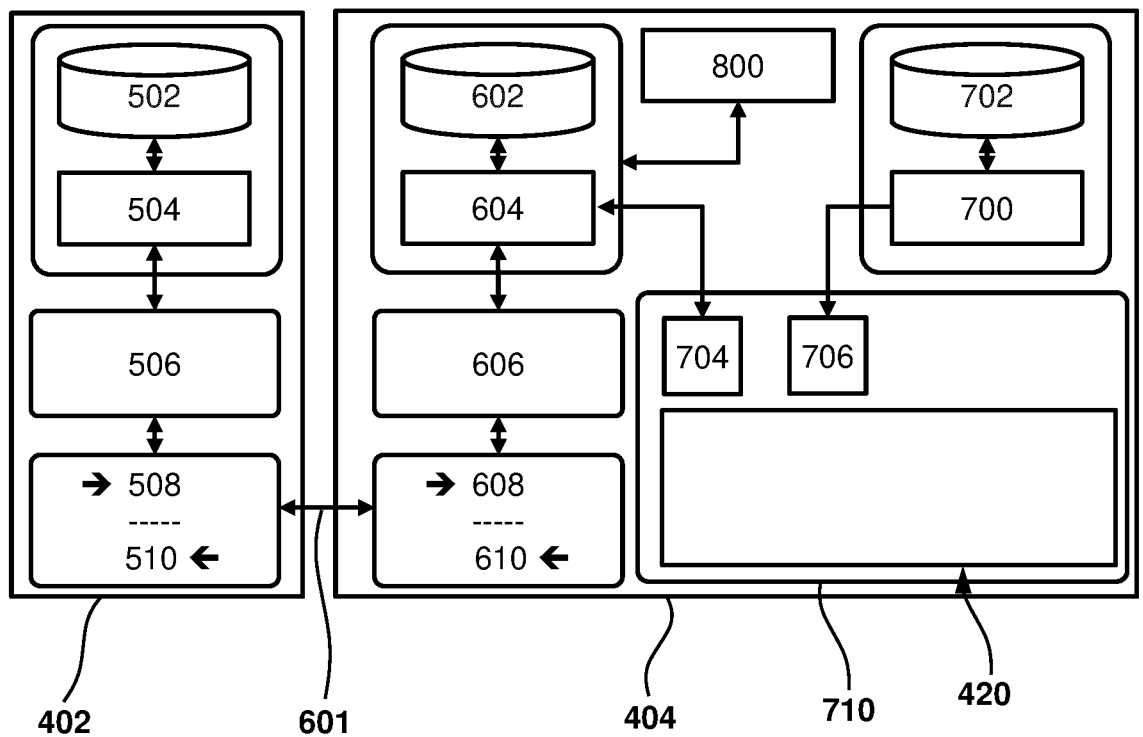
FIG. 8 illustrates a local copy of a prediction model, in accordance with an embodiment.

FIG. 8 illustrates a local copy 800 of a prediction model. In some embodiments, as shown in FIG. 8, once a local copy 800 of a prediction model achieves a sufficient predictive performance level for a particular customer at a given remote location 404, the customer may choose to forgo receiving updates to the model from service provider 402 and/or providing updated model parameters back to service provider 402. The customer may run their operations using the sufficiently performing model using their own operational data. In some embodiments, the customer may continue providing updated model parameters back to service provider 402, even while continuing to use their own local copy 800 of the model.

Figure 9:
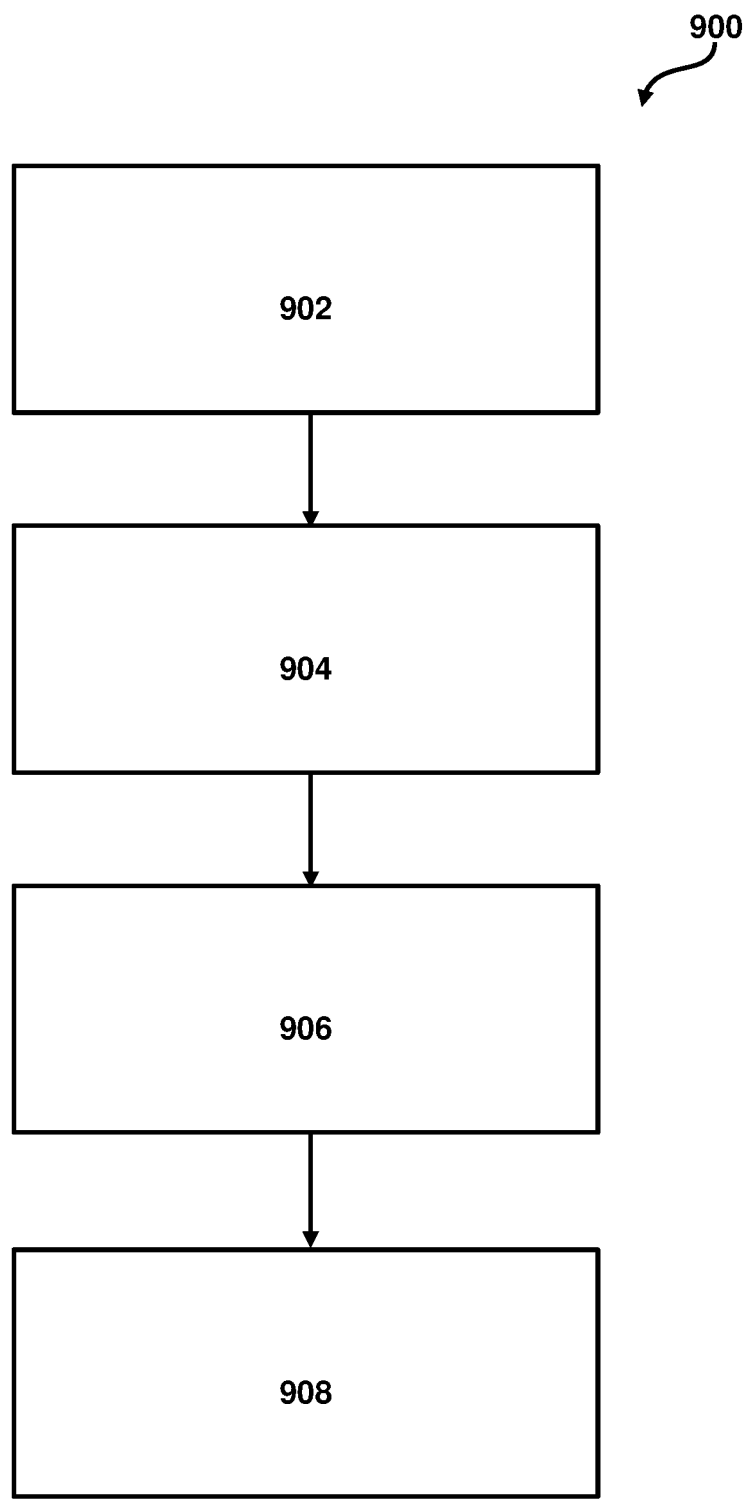
FIG. 9 illustrates a summary of operations of another present method for adjusting a prediction model used for enhancing a lithography process, according to an embodiment.

FIG. 9 illustrates a summary of operations 900 of another present method for adjusting a prediction model used for enhancing a lithography process. Method 900 comprises providing 904 local training data associated with a semiconductor manufacturing process to a prediction model. The prediction model may have various parameters (e.g., weights, biases, etc.) with corresponding values. The local training data may be provided 904 to the prediction model to determine first updated model parameter values (e.g., weights, biases, and/or other parameters). This may include executing a local gradient descent such that the weights (or a weight), the biases (or a bias), and/or other parameters are updated based on the local data.

Method 900 comprises operations 906 including receiving second updated model parameter values obtained by providing the prediction model at least partially with external training data. In some embodiments, the plurality of model parameters comprise a weight and/or a bias (and/or other parameters as described above). The first updated model parameter values may include a first updated weight value and/or bias value, for example, and the second updated model parameter values may include a second updated weight and/or bias value, for example. In some embodiments, the second updated model parameters may be provided by a service provider for example, located remotely from a customer location where the first updated model parameters are determined. In some embodiments, the service provider and/or the customer provides the prediction model with the external training data. In some embodiments, the service provider generates the external training data and may not provide the external training data to the customer.

Method 900 comprises adjusting 908 the prediction model based on an expected improvement of a prediction model accuracy. Adjusting 908 comprises updating the model parameters with the first updated model parameter values and/or second updated model parameter values. For example, if a customer who is using the prediction model decides that the first updated model parameter values (relative to the second updated model parameter values) cause the prediction model to make more accurate predictions, the customer may run the prediction model with the first updated model parameter values. This is an example only and is not intended to be limiting. In some embodiments, one of the first updated model parameters values and one of the second updated model parameter values may be used, only the second updated model parameters may be used, and/or other combinations may be used by the customer.

In an embodiment, the method further comprises, prior to providing the local training data to the prediction model, generating and/or training 902 the prediction model using global data. In an embodiment, operation 902 comprises providing the prediction model to a remote location. As described above, the remote location comprises a facility location remote from a facility location where the prediction model is generated. The remote location comprises the facility location where: the local training data associated with the semiconductor manufacturing process is provided to the prediction model to determine the first updated model parameter values; the second updated model parameter values are received; and the prediction model is adjusted.

Further embodiments of the invention are disclosed in the list of numbered clauses below:

1. A method for adjusting a lithography process, the method comprising:
   providing an initial prediction model comprising a plurality of model parameters to one or more remote locations;
   training the initial prediction model with local data at the one or more remote locations such that at least one model parameter is updated;
   receiving the at least one updated model parameter from each of the one or more remote locations where the initial prediction model was trained;
   determining aggregated updated model parameters based on the at least one updated model parameter received from the one or more remote locations; and
   adjusting the initial prediction model based on the aggregated updated model parameters, the adjusted prediction model being operable to enhance the lithography process.
2. The method of clause 1, wherein the at least one model parameter comprises a weight.
3. The method of clause 1 or 2, further comprising, prior to providing the initial prediction model to the one or more remote locations, training the initial prediction model using global data, the global data comprising a larger data set than the local data, the global data being associated with more than one of the remote locations,
   such that the training of the initial prediction model with local data at the one or more remote locations comprises retraining the initial prediction model to update the at least one model parameter.
4. The method of clause 3, wherein training the initial prediction model using global data comprises training the initial prediction model with image data associated with a reticle or collector, and defect information associated with contamination or image performance.
5. The method of any of clauses 1-4, wherein the prediction model is a neural network.
6. The method of clause 5, wherein the at least one model parameter comprises a weight and a bias of the neural network.
7. The method of any of clauses 1-6, wherein the adjusted prediction model being operable to enhance the lithography process comprises the adjusted prediction model being used to recognize reticle contamination in the lithography process.
8. The method of any of clauses 1-6, wherein the adjusted prediction model being operable to enhance the lithography process comprises the adjusted prediction model being used to determine whether collector contamination is at an acceptable level for an exposure in the lithography process.
9. The method of any of clauses 1-8, wherein the one or more remote locations comprise one or more facility locations remote from a facility location where the initial prediction model is generated and trained, the updated model parameters are received, the aggregated updated model parameters are determined, and the adjusted prediction model is determined.
10. The method of clause 9, wherein the generating and training of the initial prediction model is performed by a service provider; providing the initial prediction model to the one or more remote locations is performed by the service provider; the remote locations and the local data are associated with customers of the service provider; the updated model parameters are received from each of the one or more remote locations by the service provider; the aggregated updated model parameters received from each of the one or more remote locations are determined by the service provider; and the adjusted prediction model is determined by the service provider based on the aggregated updated model parameters.

11. The method of any of clauses 1-10, further comprising iteratively providing the adjusted prediction model to the one or more remote locations, receiving the updated model parameters, determining the aggregated updated model parameters, and readjusting the adjusted prediction model until a stop condition is satisfied.

12. The method of clause 11, wherein the stop condition comprises convergence of the readjusted prediction model.

13. The method of clause 12, wherein the convergence of the readjusted prediction model comprises an amount of change in the aggregated updated model parameters being within a threshold amount of change.

14. The method of any of clauses 1-13, wherein the local data is kept local to each of the one or more remote locations and is not shared with (1) a location that provides the initial prediction model, the updated model parameters are received, the aggregated updated model parameters are determined, and the adjusted prediction model is determined, or (2) other ones of the remote locations.

15. The method of any of clauses 1-14, wherein determining the aggregated updated model parameters comprises averaging corresponding model parameters received from each of the one or more remote locations.

16. The method of any of clauses 1-15, further comprising providing the initial prediction model to a first remote location where the initial prediction model is trained with local data such that weights of the initial prediction model are updated based on the local data at the first remote location;
   receiving the updated weights from the first remote location;
   adjusting the initial prediction model based on the updated weights received from the first remote location;
   providing the adjusted prediction model to a second remote location where the adjusted prediction model is retrained with local data such that the weights are reupdated based on the local data at the second remote location;
   receiving the reupdated weights from the second remote location; and
   readjusting the adjusted prediction model based on the reupdated weights received from the second remote location.

17. The method of clause 16, further comprising iteratively providing the readjusted prediction model to additional remote locations, receiving the reupdated weights, and further adjusting the readjusted prediction model based on the reupdated weights.

18. The method of any of clauses 1-17, further comprising performing a sanity check on one or both of the provided initial prediction model or the at least one model parameter.

19. The method of any of clauses 1-18, further comprising performing a sanity check on the updated at least one model parameter received from each of the one or more remote locations.

20. The method of any of clauses 1-19, further comprising encrypting one or both of the provided initial prediction model or the plurality of model parameters.

21. The method of clause 20, wherein the encryption is configured such that the training with local data occurs without decryption of the provided initial prediction model.

22. The method of any of clauses 1-21, further comprising decrypting the updated at least one model parameter received from each of the one or more remote locations.

23. The method of any of clauses 1-22, wherein the initial prediction model is provided to one or more model servers at each of the one or more remote locations, a given model server being separate from a local data server at a given remote location.

24. The method of any of clauses 1-23, wherein the initial prediction model comprises a partially trained prediction model, the partially trained prediction model comprising the plurality of model parameters such that, after provision to a given remote location, the training with local data comprises fully training the initial prediction model.

25. The method of clause 24, wherein a user at the given remote location determines, based on the fully trained initial prediction model, whether to communicate the updated at least one model parameter from the given remote location.

26. A method for adjusting a prediction model comprising a plurality of model parameters, the method comprising:
   providing local training data associated with a semiconductor manufacturing process to the prediction model to determine first updated model parameter values;
   receiving second updated model parameter values obtained by providing the prediction model at least partially with external training data; and
   adjusting the prediction model based on an expected improvement of a prediction model accuracy, wherein the adjusting comprises updating the model parameters with the first updated model parameter values and/or second updated model parameter values.

27. The method of clause 26, wherein the plurality of model parameters comprise a weight, the first updated model parameter values include a first updated weight value, and the second updated model parameter values include a second updated weight value.

28. The method of clause 26 or 27, further comprising, prior to providing the local training data to the prediction model, training the prediction model using global data, the global data comprising a larger data set than the local training data, the global data being associated with more than one of the remote locations.
   such that providing the local training data comprises retraining the prediction model to determine the first updated model parameter values.

29. The method of any of clauses 26-28, wherein the prediction model is a neural network.

30. The method of clause 29, wherein the plurality of model parameter comprise a weight and a bias of the neural network.

31. The method of any of clauses 26-30, further comprising providing the prediction model to a remote location, the remote location comprising a facility location remote from a facility location where the prediction model is generated, the remote location comprising the facility location where:
   the local training data associated with the semiconductor manufacturing process is provided to the prediction model to determine the first updated model parameter values;
   the second updated model parameter values are received; and
   the prediction model is adjusted.

32. The method of clause 31, wherein the prediction model is provided by a service provider, and the remote location and the local training data are associated with a customer of the service provider.

33. The method of clause 32, wherein the local training data is kept local to the customer and is not shared with the service provider.

34. The method of any of clauses 26-33, further comprising performing a sanity check on the prediction model.

35. The method of any of clauses 26-34, wherein the prediction model is encrypted.

36. A method for adjusting a neural network used for enhancing a lithography process, the method comprising:
   training an initial neural network based on training data, the training data comprising process data and corresponding performance data for the lithography process, the initial neural network comprising a plurality of weights;
   transmitting the initial neural network to one or more remote locations where the initial neural network is retrained with local data, the local data comprising process data and corresponding performance data for lithography processes associated with the remote locations, such that the weights are updated based on the local data at each of the one or more remote locations;
   receiving the updated weights from each of the one or more remote locations;
   determining aggregated updated weights received from each of the one or more remote locations; and
   adjusting the initial neural network based on the aggregated updated weights, the adjusted neural network being operable to enhance the lithography process.

37. The method of clause 36, wherein the adjusted neural network being operable to enhance the lithography process comprises the adjusted neural network being used to recognize reticle contamination in the photolithography process.

38. The method of clause 36, wherein the adjusted neural network being operable to enhance the lithography process comprises the adjusted neural network being used to determine whether collector contamination is at an acceptable level for an exposure in the photolithography process.

39. The method of any of clauses 36-38, wherein the one or more remote locations comprise one or more facility locations remote from a facility location where the initial neural network is generated and trained, the updated weights are received, the aggregated updated weights are determined, and the adjusted neural network is determined.

40. The method of any of clauses 36-39, wherein generating and training of the initial neural network is performed by a service provider; providing the initial neural network to the one or more remote locations is performed by the service provider; the remote locations and the local data are associated with customers of the service provider; the updated weights are received from each of the one or more remote locations by the service provider; the aggregated updated weights are determined by the service provider; and the adjusted neural network is determined by the service provider based on the aggregated updated weights.

41. A computer program product comprising a non-transitory computer readable medium having instructions recorded thereon, the instructions when executed by a computer implementing the method of any of clauses 1-40.

Embodiments are Provided According to the Following Clauses

1. A method for configuring a semiconductor manufacturing process, the method comprising:
   providing an initial prediction model comprising a plurality of model parameters to one or more remote locations;
   training the initial prediction model with local data at the one or more remote locations such that at least one model parameter is updated;
   receiving the at least one updated model parameter from the one or more remote locations;
   determining aggregated model parameters based on the at least one updated model parameter received from the one or more remote locations; and
   adjusting the initial prediction model based on the aggregated model parameters, the adjusted prediction model being operable to configure the semiconductor manufacturing process.

2. The method of clause 1, wherein the at least one model parameter comprises a weight.

3. The method of clause 1, further comprising, prior to providing the initial prediction model to the one or more remote locations, training the initial prediction model using global data, the global data comprising a larger data set than the local data, the global data being associated with more than one of the remote locations, such that the training of the initial prediction model with local data at the one or more remote locations comprises retraining the initial prediction model.

4. The method of clause 3, wherein training the initial prediction model using global data comprises training the initial prediction model with: i) image data associated with a reticle or collector comprised within a lithographic apparatus used in the semiconductor manufacturing process, and ii) defect information associated with contamination or imaging performance of the lithographic apparatus.

5. The method of clause 4, wherein the adjusted prediction model is operable to determine whether a quality of the collector is at an acceptable level.

6. The method of clause 1, wherein the prediction model is a neural network and wherein the at least one model parameter comprises a weight and/or a bias of the neural network.

7. The method of clause 1, wherein the one or more remote locations comprise one or more facility locations remote from a facility location where the initial prediction model is generated and trained, the updated model parameters are received, the aggregated updated model parameters are determined, and the adjusted prediction model is determined.

8. The method of clause 1, further comprising iteratively providing the adjusted prediction model to the one or more remote locations, receiving the updated model parameters, determining the aggregated updated model parameters, and readjusting the adjusted prediction model until a stop condition is satisfied.

9. The method of clause 8, wherein the stop condition comprises convergence of the readjusted prediction model.

10. The method of clause 1, wherein the initial prediction model comprises a partially trained prediction model, the partially trained prediction model comprising the plurality of model parameters such that, after provision to a given remote location, the training with local data comprises fully training the initial prediction model.

11. The method of clause 10, wherein a user at the given remote location determines, based on the fully trained initial prediction model, whether to communicate the updated at least one model parameter from the given remote location.

12. A method for adjusting a prediction model comprising a plurality of model parameters, the method comprising:
   providing local training data associated with a semiconductor manufacturing process to the prediction model to determine first updated model parameter values;

receiving second updated model parameter values obtained by providing the prediction model at least partially with external training data; and adjusting the prediction model based on an expected improvement of a prediction model accuracy, wherein the adjusting comprises updating the model parameters with the first updated model parameter values and/or second updated model parameter values.

13. The method of clause 12, wherein the plurality of model parameters comprise a weight, the first updated model parameter values include a first updated weight value, and the second updated model parameter values include a second updated weight value.

14. The method of clause 12 or 13, further comprising, prior to providing the local training data to the prediction model, training the prediction model using global data, the global data comprising a larger data set than the local training data, the global data being associated with more than one of the remote locations.

such that providing the local training data comprises retraining the prediction model to determine the first updated model parameter values.

15. The method of clause 12, further comprising providing the prediction model to a remote location, the remote location comprising a facility location remote from a facility location where the prediction model is generated, the remote location comprising the facility location where:

the local training data associated with the semiconductor manufacturing process is provided to the prediction model to determine the first updated model parameter values;

the second updated model parameter values are received; and the prediction model is adjusted.

16. A computer program product comprising a non-transitory computer readable medium having instructions recorded thereon, the instructions when executed by a computer implementing the method of clause 1.

17. A computer program product comprising a non-transitory computer readable medium having instructions recorded thereon, the instructions when executed by a computer implementing the method of clause 12.

Figure 10:
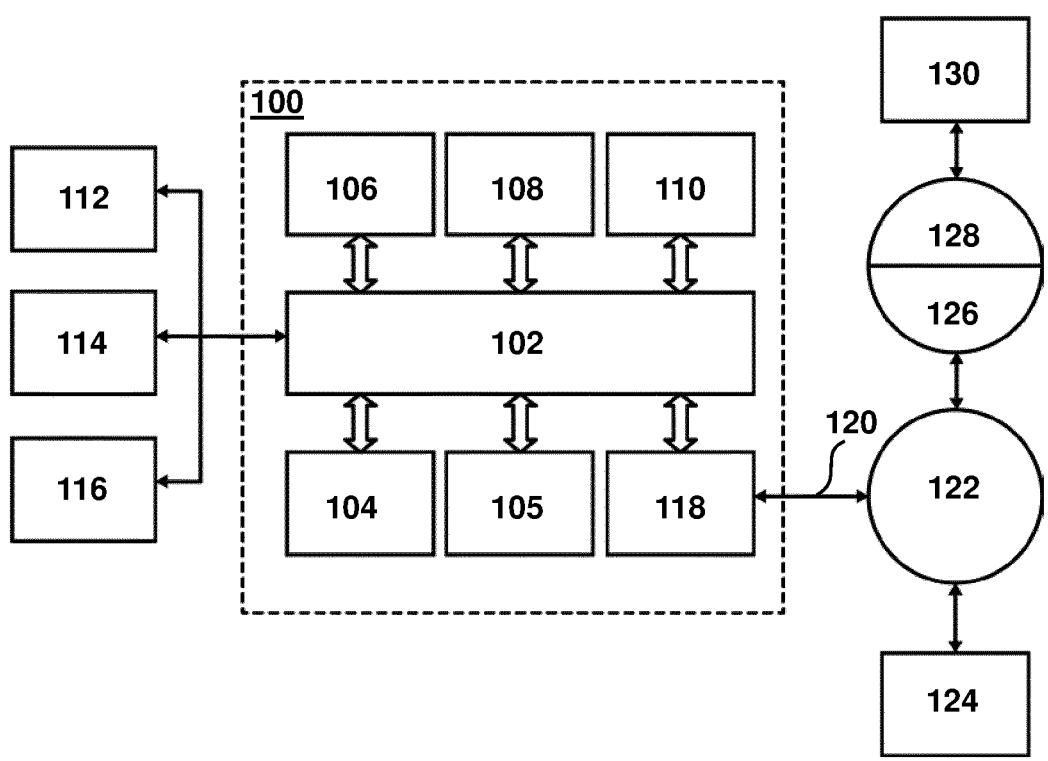
FIG. 10 is a block diagram of an example computer system, according to an embodiment.

FIG. 10 is a block diagram that illustrates a computer system 100 that can assist in implementing the methods, flows, or the systems disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of one or more methods described herein may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may also include a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide all or part of a method described herein, for example. The received code may be executed by processor 104 as it is received, and/or stored in storage device 110, or other non-volatile storage for later execution. In this manner, computer system 100 may obtain application code in the form of a carrier wave.

Figure 11:
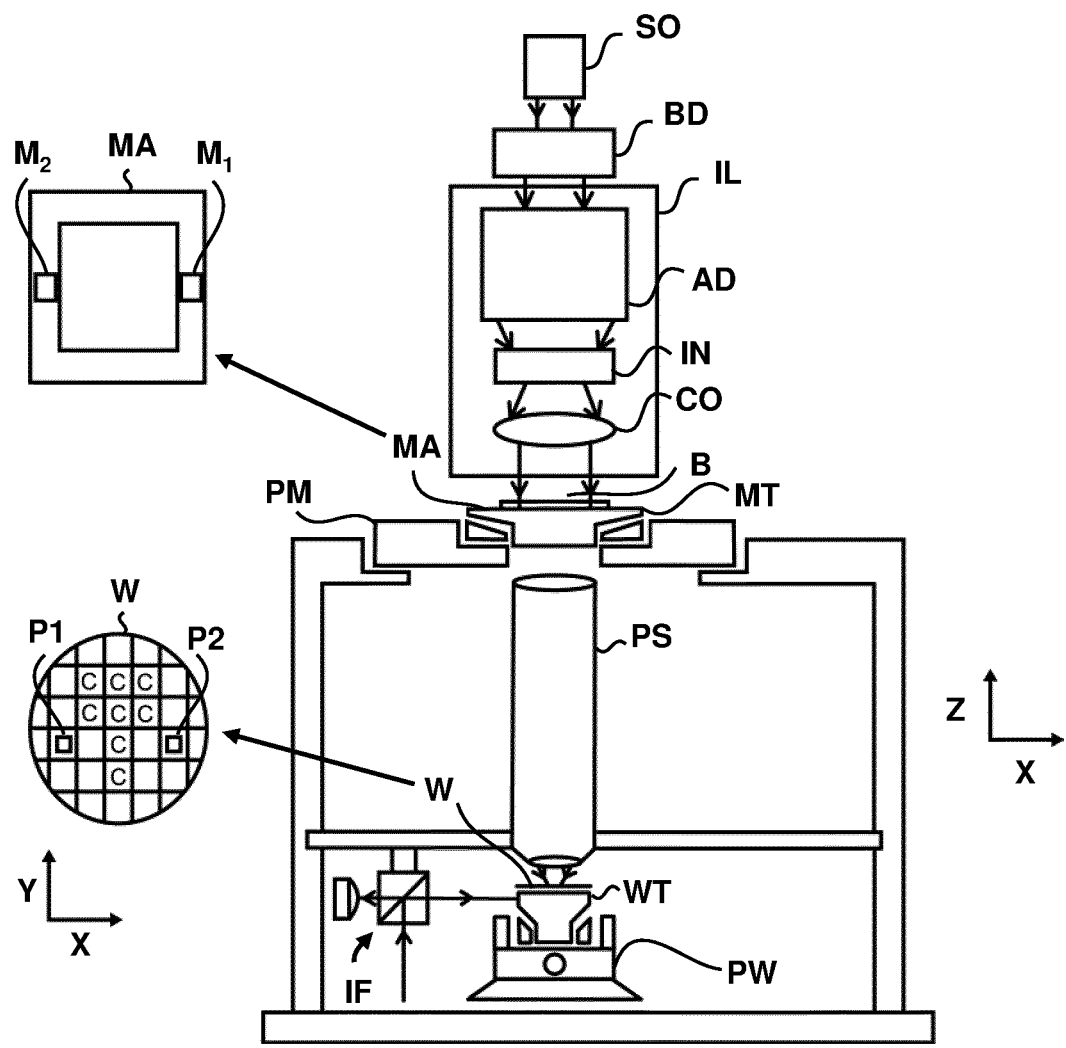
FIG. 11 is a schematic diagram of a lithographic projection apparatus, according to an embodiment.

FIG. 11 schematically depicts an exemplary lithographic projection apparatus that may be utilized in conjunction with the techniques described herein. The apparatus comprises:
- an illumination system IL, to condition a beam B of radiation. In this particular case, the illumination system also comprises a radiation source SO;
- a first object table (e.g., patterning device table) MT provided with a patterning device holder to hold a patterning device MA (e.g., a reticle), and connected to a first positioner to accurately position the patterning device with respect to item PS;
- a second object table (substrate table) WT provided with a substrate holder to hold a substrate W (e.g., a resist-coated silicon wafer), and connected to a second positioner to accurately position the substrate with respect to item PS; and
- a projection system ("lens") PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive patterning device). However, in general, it may also be of a reflective type, for example (with a reflective patterning device). The apparatus may employ a different kind of patterning device relative to classic mask; examples include a programmable mirror array or LCD matrix.

The source SO (e.g., a mercury lamp or excimer laser, LPP (laser produced plasma) EUV source) produces a beam of radiation. This beam is fed into an illumination system (illuminator) IL, either directly or after having traversed conditioning means, such as a beam expander Ex, for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

It should be noted with regard to FIG. 10 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or $F_2$ lasing).

The beam PB subsequently intercepts the patterning device MA, which is held on a patterning device table MT. Having traversed the patterning device MA, the beam B passes through the lens PL, which focuses the beam B onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted in FIG. 11. However, in the case of a stepper (as opposed to a step-and-scan tool) the patterning device table MT may just be connected to a short stroke actuator, or may be fixed.

The depicted tool can be used in two different modes:
- In step mode, the patterning device table MT is kept essentially stationary, and an entire patterning device image is projected in one go (i.e., a single "flash") onto a target portion C. The substrate table WT is then shifted in the x and/or y directions so that a different target portion C can be irradiated by the beam PB;
- In scan mode, essentially the same scenario applies, except that a given target portion C is not exposed in a single "flash". Instead, the patterning device table MT is movable in a given direction (the so-called "scan direction", e.g., the y direction) with a speed v, so that the projection beam B is caused to scan over a patterning device image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 12:
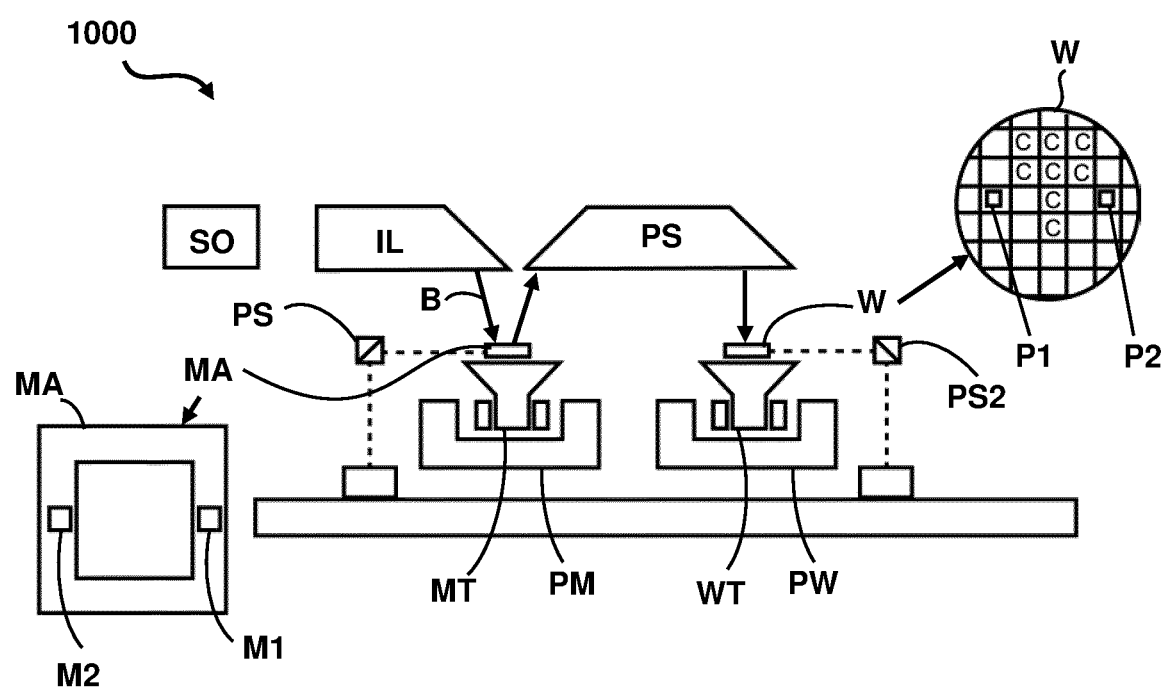
FIG. 12 is a schematic diagram of another lithographic projection apparatus, according to an embodiment.

FIG. 12 schematically depicts another exemplary lithographic projection apparatus 1000 that can be utilized in conjunction with the techniques described herein.

The lithographic projection apparatus 1000 comprises:
- a source collector module SO
- an illumination system (illuminator) IL configured to condition a radiation beam B (e.g. EUV radiation).
- a support structure (e.g. a patterning device table) MT constructed to support a patterning device (e.g. a mask or a reticle) MA and connected to a first positioner PM configured to accurately position the patterning device;

a substrate table (e.g. a wafer table) WT constructed to hold a substrate (e.g. a resist coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

As depicted in FIG. 12, the apparatus 1000 is of a reflective type (e.g. employing a reflective patterning device). It is to be noted that because most materials are absorptive within the EUV wavelength range, the patterning device may have multilayer reflectors comprising, for example, a multi-stack of Molybdenum and Silicon. In one example, the multi-stack reflector has 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

The illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 12, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source. In an embodiment, a DUV laser source may be used.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., patterning device table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus 1000 could be used in at least one of the following modes:

In step mode, the support structure (e.g. patterning device table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

In scan mode, the support structure (e.g. patterning device table) MT and the substrate table WT are scanned synchronously while a pattern imparted to the radiation beam is projected onto a target portion C (i.e. a single dynamic exposure). The velocity and direction of the substrate table WT relative to the support structure (e.g. patterning device table) MT may be determined by the (de-)magnification and image reversal characteristics of the projection system PS.

In another mode, the support structure (e.g. patterning device table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 13:
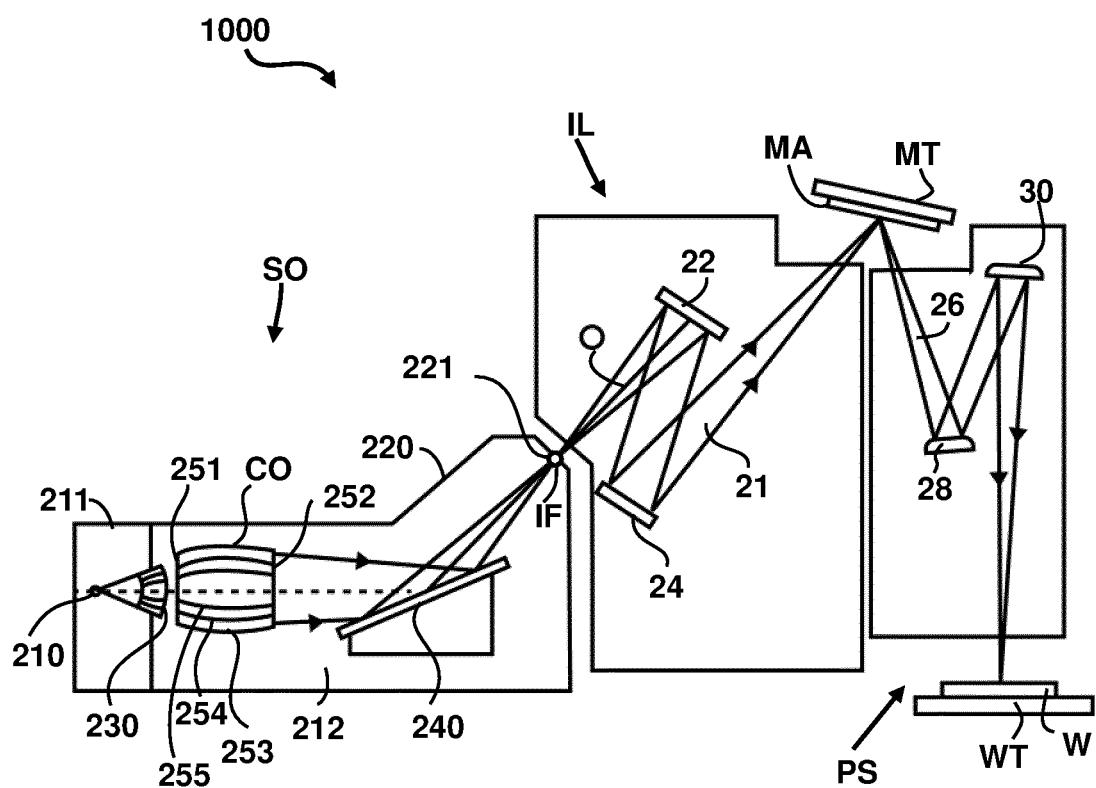
FIG. 13 is a more detailed view of the apparatus in FIG. 12, according to an embodiment.

FIG. 13 shows the apparatus 1000 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 13.

Figure 14:
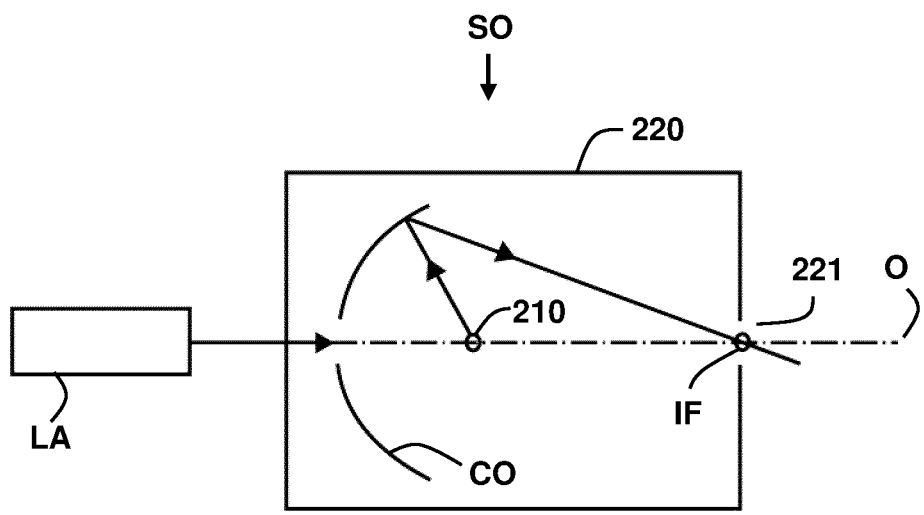
FIG. 14 is a more detailed view of the source collector module SO of the apparatus of FIG. 12 and FIG. 13, according to an embodiment.

Collector optic CO, as illustrated in FIG. 14, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type may be used in combination with a discharge produced plasma source, often called a DPP source.

Alternatively, the source collector module SO may be part of an LPP radiation system as shown in FIG. 14. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The concepts disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The descriptions above are intended to be illustrative, not limiting. Thus, it will be apparent to one skilled in the art that modifications may be made as described without departing from the scope of the claims set out below.

What is claimed is:

1. A method for configuring a semiconductor manufacturing process, the method comprising:
providing an initial prediction computer model comprising a plurality of model parameters to one or more remote locations, the model parameters being configuration variables internal to the model that determine how input data is transformed to output data;
receiving at least one updated model parameter from the one or more remote locations, wherein the at least one updated model parameter is generated from training of the initial prediction model with local data at the one or more remote locations;
determining aggregated model parameters based on the at least one updated model parameter received from the one or more remote locations;
adjusting the initial prediction model based on the aggregated model parameters, the adjusted prediction model being operable to configure the semiconductor manufacturing process; and
prior to providing the initial prediction model to the one or more remote locations, training the initial prediction model using global data, the global data comprising a larger data set than the local data, the global data being associated with more than one of the remote locations such that the training of the initial prediction model with local data at the one or more remote locations comprises retraining the initial prediction model, and the global data comprising i) process data associated with a semiconductor manufacturing apparatus used in the semiconductor manufacturing process, and ii) defect information associated with the semiconductor manufacturing apparatus.

2. The method of claim 1, wherein the at least one model parameter comprises a weight.

3. The method of claim 1, wherein the adjusted prediction model is operable to determine whether a quality of the semiconductor manufacturing apparatus is at an acceptable level.

4. The method of claim 1, wherein the prediction model is a neural network and wherein the at least one model parameter comprises a weight and/or a bias of the neural network.

5. The method of claim 1, wherein the one or more remote locations comprise one or more facility locations remote from a facility location where the initial prediction model is generated and trained, the at least one updated model parameter is received, the aggregated updated model parameters are determined, and the adjusted prediction model is determined.

6. The method of claim 1, further comprising iteratively providing the adjusted prediction model to the one or more remote locations, receiving the at least one updated model parameter, determining the aggregated updated model parameters, and readjusting the adjusted prediction model, until a stop condition is satisfied.

7. The method of claim 1, wherein the initial prediction model comprises a partially trained prediction model, the partially trained prediction model comprising the plurality of model parameters such that, after provision to a given remote location, the training with local data comprises fully training the initial prediction model.

8. The method of claim 7, wherein a user at the given remote location determines, based on the fully trained initial prediction model, whether to communicate the updated at least one model parameter from the given remote location.

9. A method for adjusting a computer prediction model comprising a plurality of model parameters, the method comprising:
provcing local training data associated with a semiconductor manufacturing process to the prediction model to determine first updated model parameter values, the model parameter values being configuration values internal to the model that determine how input data is transformed to output data;
receiving second updated model parameter values obtained by providing the prediction model at least partially with external training data;
adjusting the prediction model based on an expected improvement of a prediction model accuracy, wherein the adjusting comprises updating the model parameters with the first updated model parameter values and/or second updated model parameter values; and
prior to providing the local training data to the prediction model, the prediction model was trained using global data, the global data comprising a larger data set than the local training data, the global data being associated with more than one of the remote locations such that providing the local training data comprises retraining the prediction model to determine the first updated model parameter values, and the global data comprising i) process data associated with a semiconductor manufacturing apparatus used in the semiconductor manufacturing process, and ii) defect information associated with the semiconductor manufacturing apparatus.

10. The method of claim 9, wherein the plurality of model parameters comprise a weight, the first updated model parameter values include a first updated weight value, and the second updated model parameter values include a second updated weight value.

11. The method of claim 9, further comprising providing the prediction model to a remote location, the remote location comprising a facility location remote from a facility location where the prediction model is generated, the remote location comprising the facility location where:
the local training data associated with the semiconductor manufacturing process is provided to the prediction model to determine the first updated model parameter values;
the second updated model parameter values are received; and
the prediction model is adjusted.

12. A computer program product comprising a non-transitory computer readable medium having instructions therein, the instructions, when executed by a computer system, configured to cause the computer system to at least:
provide an initial prediction model comprising a plurality of model parameters to one or more remote locations, the model parameters being configuration variables internal to the model that determine how input data is transformed to output data;
receive at least one updated model parameter from the one or more remote locations, wherein the at least one updated model parameter is generated from training of the initial prediction model with local data at the one or more remote locations;
determine aggregated model parameters based on the at least one updated model parameter received from the one or more remote locations;
adjust the initial prediction model based on the aggregated model parameters, the adjusted prediction model being operable to configure the semiconductor manufacturing process; and
prior to provision of the initial prediction model to the one or more remote locations, train the initial prediction model using global data, the global data comprising a larger data set than the local data, the global data being associated with more than one of the remote locations such that the training of the initial prediction model with local data at the one or more remote locations comprises retraining the initial prediction model, and the global data comprising i) process data associated with a semiconductor manufacturing apparatus used in the semiconductor manufacturing process, and ii) defect information associated with the semiconductor manufacturing apparatus.

13. The computer program product of claim 12, wherein the instructions are further configured to cause the computer system to iteratively provide the adjusted prediction model to the one or more remote locations, receive the at least one updated model parameter, determine the aggregated updated model parameters, and readjust the adjusted prediction model, until a stop condition is satisfied.

14. The computer program product of claim 12, wherein the at least one model parameter comprises a weight.

15. The computer program product of claim 12, wherein the adjusted prediction model is operable to determine whether a quality of the semiconductor manufacturing apparatus is at an acceptable level.

16. The computer program product of claim 12, wherein the prediction model is a neural network and wherein the at least one model parameter comprises a weight and/or a bias of the neural network.

17. A computer program product comprising a non-transitory computer readable medium having instructions therein, the instructions, when executed by a computer system, configured to cause the computer system to at least:
provide local training data associated with a semiconductor manufacturing process to a prediction model comprising a plurality of model parameters to determine first updated model parameter values, the model parameter values being configuration values internal to the model that determine how input data is transformed to output data;
receive second updated model parameter values obtained by providing the prediction model at least partially with external training data; and
adjust the prediction model based on an expected improvement of a prediction model accuracy, wherein the adjustment comprises an update of the model parameters with the first updated model parameter values and/or second updated model parameter values, and
wherein, prior to provision of the local training data to the prediction model, the prediction model was trained using global data, the global data comprising a larger data set than the local training data, the global data being associated with more than one of the remote locations such that providing the local training data comprises retraining the prediction model to determine the first updated model parameter values, and the global data comprising i) process data associated with a semiconductor manufacturing apparatus used in the semiconductor manufacturing process, and ii) defect information associated with the semiconductor manufacturing apparatus.

18. The computer program product of claim 17, wherein the instructions are further configured to cause the computer system to provide the prediction model to a remote location, the remote location comprising a facility location remote from a facility location where the prediction model is generated, the remote location comprising the facility location where:

the local training data associated with the semiconductor manufacturing process is provided to the prediction model to determine the first updated model parameter values;

the second updated model parameter values are received; and the prediction model is adjusted.

19. The computer program product of claim 17, wherein the prediction model is a neural network and wherein the model parameters comprise a weight and/or a bias of the neural network.

20. The computer program product of claim 17, wherein the plurality of model parameters comprise a weight, the first updated model parameter values include a first updated weight value, and the second updated model parameter values include a second updated weight value.

\* \* \* \* \*